(12) United States Patent
Sekine et al.

(10) Patent No.: US 12,408,446 B2
(45) Date of Patent: Sep. 2, 2025

(54) PHOTOELECTRIC CONVERSION DEVICE, PHOTOELECTRIC CONVERSION SYSTEM, AND EQUIPMENT

(71) Applicant: CANON KABUSHIKI KAISHA, Tokyo (JP)

(72) Inventors: Hiroshi Sekine, Kanagawa (JP); Kazuhiro Morimoto, Kanagawa (JP); Junji Iwata, Tokyo (JP); Aymantarek Abdelghafar, Tokyo (JP); Hiroyuki Tsuchiya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 448 days.

(21) Appl. No.: 18/147,079

(22) Filed: Dec. 28, 2022

(65) Prior Publication Data

US 2023/0215884 A1   Jul. 6, 2023

(30) Foreign Application Priority Data

Jan. 1, 2022   (JP) ................................ 2022-000023

(51) Int. Cl.
*H10F 30/225*   (2025.01)
*H10F 39/00*   (2025.01)
*H10F 39/12*   (2025.01)

(52) U.S. Cl.
CPC ......... *H10F 30/225* (2025.01); *H10F 39/199* (2025.01); *H10F 39/8033* (2025.01);
(Continued)

(58) Field of Classification Search
CPC ...... H10F 30/225; H10F 39/807; H10F 39/80; H10F 39/8033; H10F 39/199;
(Continued)

(56) References Cited

U.S. PATENT DOCUMENTS 8,648,944 B2   2/2014   Iwata
8,697,500 B2   4/2014   Iwata
(Continued)

FOREIGN PATENT DOCUMENTS

JP   2018-201005 A   12/2018
JP   2019-102618 A   6/2019
(Continued)

*Primary Examiner* — Scott B Geyer
(74) *Attorney, Agent, or Firm* — Venable LLP

(57) ABSTRACT

A photoelectric conversion device includes a connecting portion that electrically connects a contact plug of anode wiring and the second semiconductor region of the isolation portion. The connecting portion includes a third semiconductor region of the second conducting type that is connected to the contact plug of the anode wiring, and a fourth semiconductor region of the second conducting type that is disposed between the third semiconductor region and the second semiconductor region. The impurity concentration of the third semiconductor region is higher than the impurity concentration of the second semiconductor region and the impurity concentration of the fourth semiconductor region is lower than the impurity concentration of the third semiconductor region. With respect to a direction in which the APDs are arrayed, the width of the isolation portion is smaller than the width of the connecting portion.

20 Claims, 27 Drawing Sheets

(52) U.S. Cl.
CPC ......... *H10F 39/807* (2025.01); *H10F 39/809* (2025.01); *H10F 39/811* (2025.01)

(58) Field of Classification Search
CPC .... H10F 39/809; H10F 39/811; H10F 39/014; H10F 39/12; H10F 39/18; H10F 39/8037
See application file for complete search history.

(56) References Cited

U.S. PATENT DOCUMENTS

| | | |
|---|---|---|
| 9,543,340 B2 | 1/2017 | Iwata |
| 9,979,916 B2 | 5/2018 | Hiyama |
| 10,009,560 B2 | 6/2018 | Kobayashi |
| 10,121,816 B2 | 11/2018 | Iwata |
| 10,186,532 B2 | 1/2019 | Kobayashi |
| 10,205,894 B2 | 2/2019 | Kawabata |
| 10,483,307 B2 | 11/2019 | Sekine |
| 10,535,688 B2 | 1/2020 | Onuki |
| 10,645,322 B2 | 5/2020 | Sekine |
| 10,771,718 B2 | 9/2020 | Kawabata |
| 10,805,563 B2 | 10/2020 | Ikeda |
| 10,818,715 B2 | 10/2020 | Iwata |
| 10,833,207 B2 | 11/2020 | Iwata |
| 10,848,695 B2 | 11/2020 | Miki |
| 11,056,519 B2 | 7/2021 | Inui |
| 11,056,520 B2 | 7/2021 | Onuki |
| 11,094,731 B2 | 8/2021 | Seto |
| 11,297,273 B2 | 4/2022 | Sekine |
| 11,393,870 B2 | 7/2022 | Inui |
| 2010/0127314 A1* | 5/2010 | Frach .................. H10F 71/121 257/292 |
| 2014/0291481 A1* | 10/2014 | Zhang .................... H10F 77/00 257/431 |
| 2015/0200222 A1* | 7/2015 | Webster ................ H10F 30/225 250/208.1 |
| 2019/0252442 A1* | 8/2019 | Tanaka .................. H10F 77/413 |
| 2020/0028018 A1 | 1/2020 | Iwata |
| 2020/0194491 A1* | 6/2020 | Inui ........................ H04N 25/77 |
| 2020/0273894 A1 | 8/2020 | Inui et al. |
| 2021/0234057 A1* | 7/2021 | Lu ......................... H10F 39/811 |
| 2021/0296383 A1 | 9/2021 | Inui |
| 2022/0020789 A1* | 1/2022 | Otake ................. H10F 39/8033 |
| 2022/0037380 A1 | 2/2022 | Shinohara |
| 2022/0093662 A1 | 3/2022 | Shinohara |
| 2022/0115366 A1 | 4/2022 | Ota |
| 2022/0165902 A1 | 5/2022 | Okazaki et al. |
| 2022/0238743 A1 | 7/2022 | Abdelghafar |
| 2022/0254818 A1* | 8/2022 | Park ....................... H10F 39/807 |
| 2022/0302194 A1* | 9/2022 | Huang .................. H10F 77/413 |
| 2023/0038959 A1 | 2/2023 | Sekine |
| 2023/0053980 A1 | 2/2023 | Shirahige |
| 2023/0066769 A1* | 3/2023 | Jung ..................... H10F 30/225 |
| 2023/0097091 A1* | 3/2023 | Morimoto ............. H10F 39/807 257/291 |
| 2023/0115792 A1* | 4/2023 | Maehashi ................ H10F 77/50 257/292 |
| 2023/0238405 A1* | 7/2023 | Shimada ............... H10F 30/225 257/431 |
| 2024/0014343 A1* | 1/2024 | Sano .................... H10F 30/2255 |
| 2024/0038913 A1* | 2/2024 | Tanaka .................. G01S 17/931 |

FOREIGN PATENT DOCUMENTS

| | | |
|---|---|---|
| JP | 2020-141122 A | 9/2020 |
| JP | 2020-170812 A | 10/2020 |
| JP | 2021-068811 A | 4/2021 |

\* cited by examiner

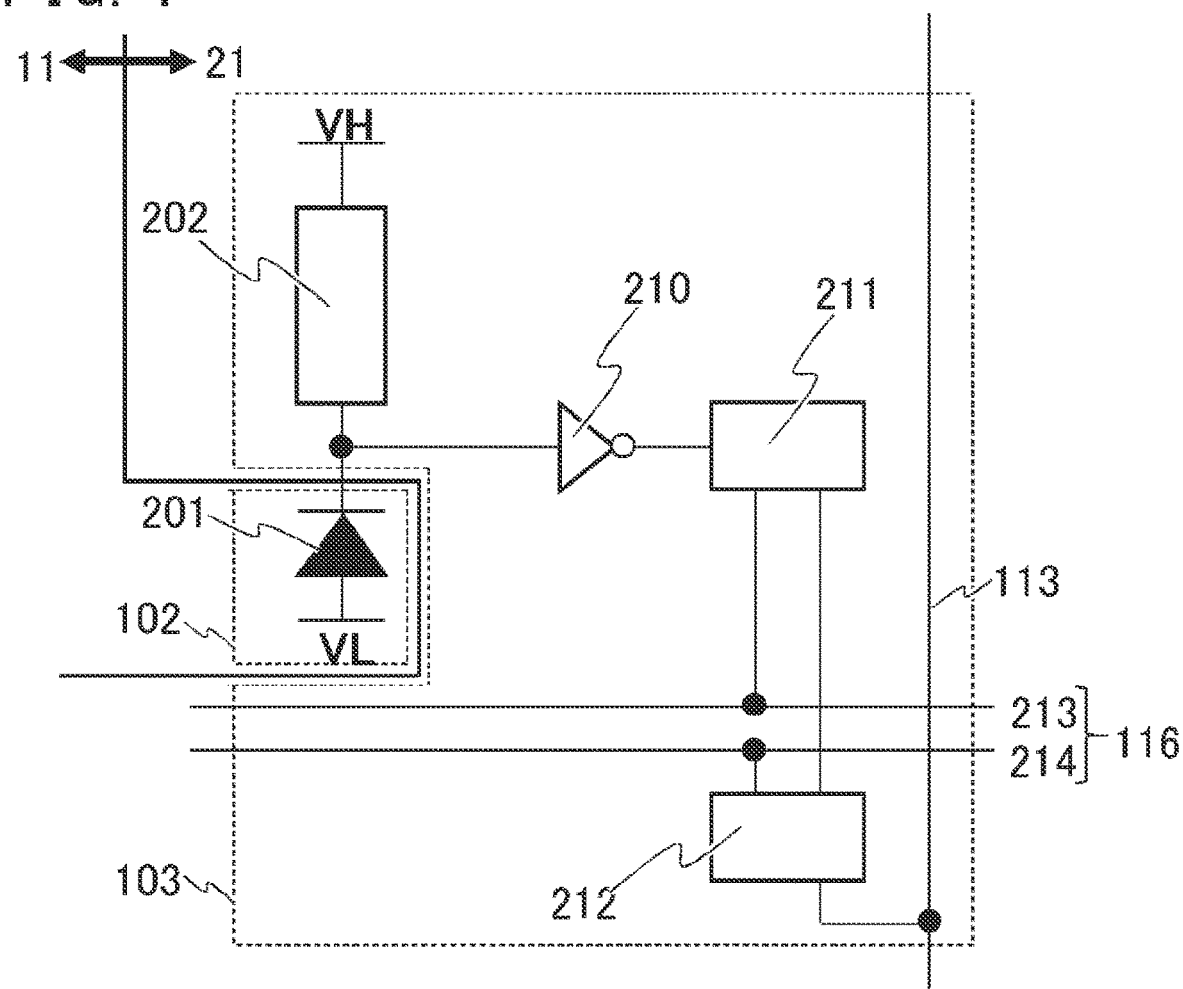

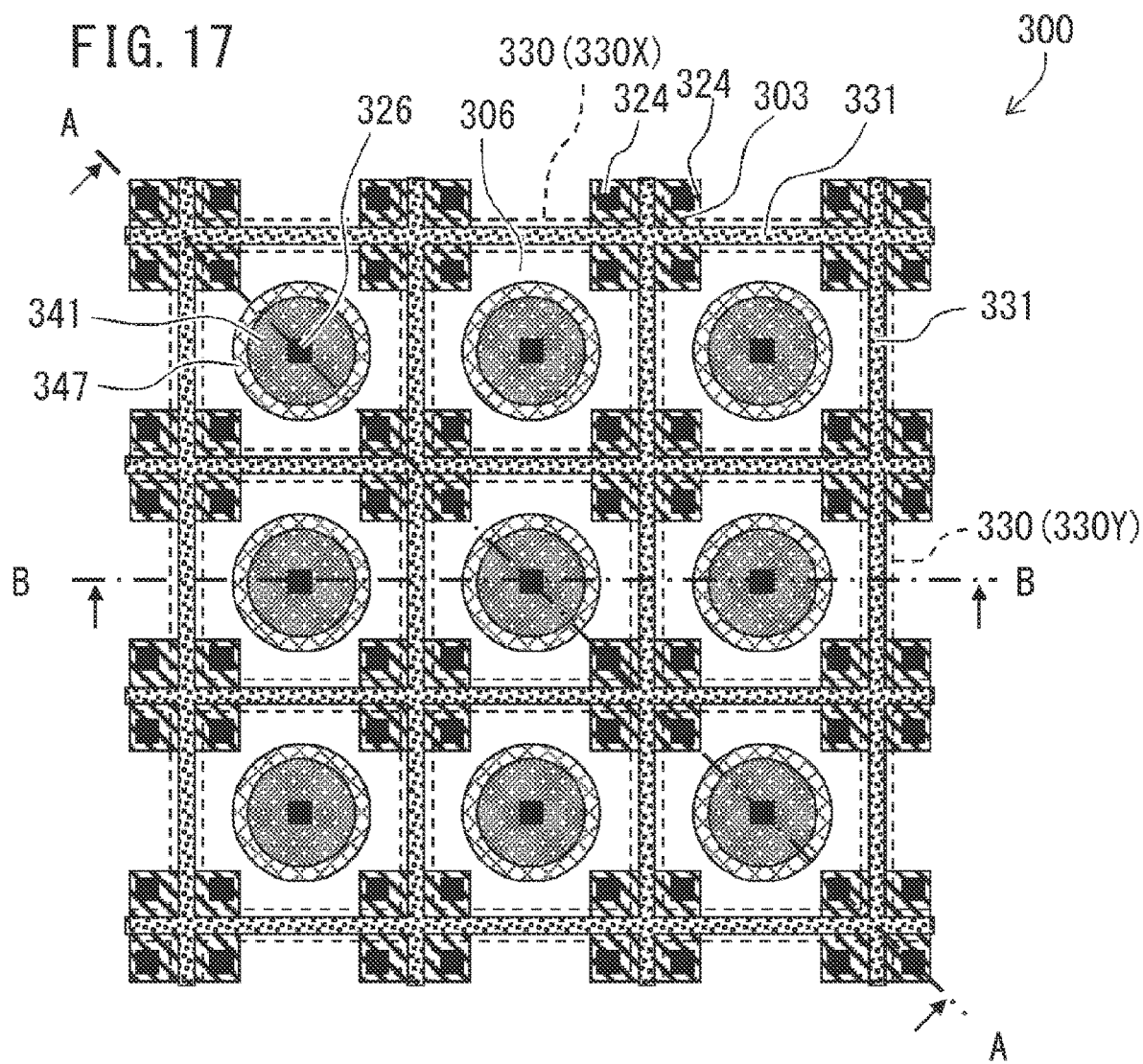

PHOTOELECTRIC CONVERSION DEVICE, PHOTOELECTRIC CONVERSION SYSTEM, AND EQUIPMENT

BACKGROUND OF THE INVENTION

Field of the Invention

Technology of the present disclosure relates to a photoelectric conversion device, a photoelectric conversion system, and an equipment having the same.

Description of the Related Art

There is known a photoelectric conversion device using an avalanche photodiode (APD) that is capable of detecting faint light on the level of individual photons by taking advantage of avalanche (electron avalanche) multiplication. In an APD, a high field region (avalanche multiplication portion) is formed by a junction of a p-type semiconductor region and an n-type semiconductor region.

Japanese Patent Application Publication No. 2018-201005 discloses an APD in which an isolation structure of a silicon oxide film is disposed surrounding an avalanche multiplication portion. There is anticipation that such an isolation structure will be effective in reducing crosstalk between adjacent pixels.

However, when the isolation structure and the avalanche multiplication portion become nearer as a result of miniaturizing pixel sizes, there is a likelihood of increase in dark count rate (DCR) when a local high field acts between the two.

Also, the isolation structure itself is a dead region (i.e., charges generated within the isolation structure are not collected at the avalanche multiplication portion and are not detected), and accordingly, there is a problem in that the greater the region of the isolation structure is as compared to the APD, the lower the sensitivity becomes. Still, simply making the isolation structure narrower (thinner) can create a different problem in that electrical connection between the isolation structure and the anode becomes poor.

SUMMARY OF THE INVENTION

Accordingly, an issue in high-definition photoelectric conversion devices is to suppress DCR and suppress deterioration in sensitivity while maintaining inter-pixel isolation performance.

According to an aspect of the present disclosure, it is provided a photoelectric conversion device including a first avalanche photodiode and a second avalanche photodiode that each have a first semiconductor region of a first conducting type in which a carrier of a same conducting type as a signal charge is a majority carrier, an isolation portion that is disposed between the first avalanche photodiode and the second avalanche photodiode, and that includes a second semiconductor region of a second conducting type that is a conducting type that is different from the first conducting type, and a connecting portion that electrically connects a contact plug of anode wiring and the second semiconductor region of the isolation portion to each other, wherein the connecting portion includes a third semiconductor region of the second conducting type that is connected to the contact plug of the anode wiring, and a fourth semiconductor region of the second conducting type that is disposed between the third semiconductor region and the second semiconductor region, an impurity concentration of the third semiconductor region is higher than the impurity concentration of the second semiconductor region, the impurity concentration of the fourth semiconductor region is lower than the impurity concentration of the third semiconductor region, and with respect to a first direction that is a direction in which the first avalanche photodiode and the second avalanche photodiode are arrayed, a width of the isolation portion is smaller than a width of the connecting portion.

According to another aspect of the present disclosure, it is provide a photoelectric conversion device including a first avalanche photodiode and a second avalanche photodiode that each have a first semiconductor region of a first conducting type in which a carrier of a same conducting type as a signal charge is a majority carrier, an isolation portion that is disposed between the first avalanche photodiode and the second avalanche photodiode, and that includes a second semiconductor region of a second conducting type that is a conducting type that is different from the first conducting type, a connecting portion of the second conducting type that electrically connects a contact plug of anode wiring and the second semiconductor region of the isolation portion to each other, a fifth semiconductor region of the second conducting type that is disposed further toward an incident side of light than the first semiconductor region, and a sixth semiconductor region that is made up of a semiconductor region of the first conducting type of which the impurity concentration that is lower than the impurity concentration of the first semiconductor region, or a semiconductor region of the second conducting type of which the impurity concentration is lower than the impurity concentration of the fifth semiconductor region, wherein the first semiconductor region and the fifth semiconductor region form an avalanche multiplication portion, with respect to a first direction that is a direction in which the first avalanche photodiode and the second avalanche photodiode are arrayed, a width of the isolation portion is smaller than a width of the connecting portion, and the sixth semiconductor region is disposed between the connecting portion and the fifth semiconductor region.

According to yet another aspect of the present disclosure, it is provided a photoelectric conversion system including the above photoelectric conversion device and an equipment including the above photoelectric conversion device.

Further features of the present invention will become apparent from the following description of exemplary embodiments with reference to the attached drawings.

BRIEF DESCRIPTION OF THE DRAWINGS

FIG. 4 is a configuration example of a pixel circuit of the photoelectric conversion device;

FIG. 17 is a plan view of a photoelectric conversion device according to Example 6;

DESCRIPTION OF THE EMBODIMENTS

Figure 1:
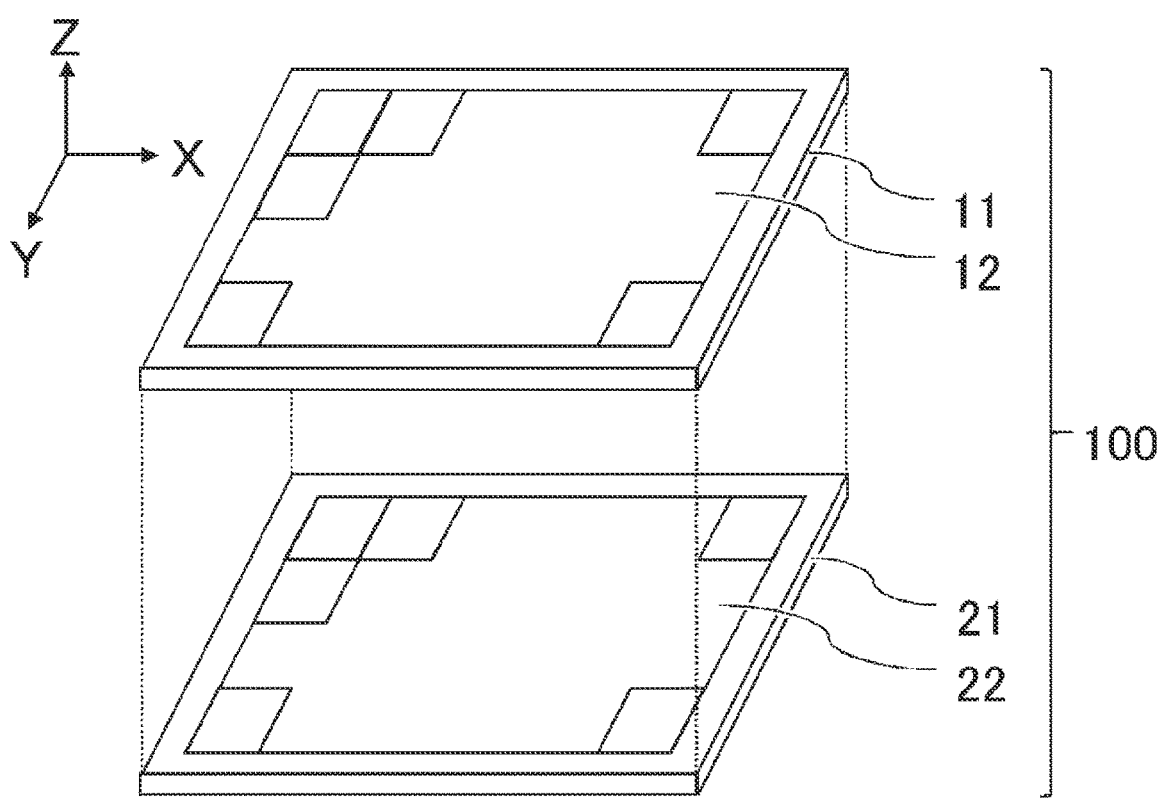
FIG. 1 is a schematic diagram of a photoelectric conversion device.

The embodiment described below is for substantiation of the technical ideal of the technology according to the present disclosure, and does not limit the technology according to the present disclosure. Sizes and positional relations of members in the Figures may be exaggerated in order to clarify the description. Like configurations in the following description are denoted by like signs, and description thereof may be omitted.

An embodiment of technology according to the present disclosure will be described in detail below with reference to the Figures. Note that terms indicating particular directions and positions (e.g., "up", "down", "right", "left", and terms including such terms) are used in the following description as necessary. Usage of such terms is to facilitate understanding of the embodiment with reference to the Figures, and the meaning of such terms do not limit the technical scope of the technology according to the present disclosure.

In the present specification, the term "plan view" means to view from a perpendicular direction as to a face of optical incidence of a semiconductor layer. Also, the term "cross-section" means a face in the perpendicular direction as to the face of optical incidence of the semiconductor layer. Note that in a case in which the face of optical incidence of the semiconductor layer is a coarse surface in microscopic view, the plan view is defined with the face of optical incidence of the semiconductor layer in macroscopic view as a reference.

The semiconductor layer has a first face, and a second face that is the face on the opposite side from the first face and to which light is incident. In the present specification, a depth direction is a direction from the first face of the semiconductor layer on which avalanche photodiodes (APDs) are disposed toward the second face. Hereinafter, the "first face" may be referred to as "front face", and the "second face" may be referred to as "rear face". The "depth" at a certain point or a certain region within the semiconductor layer means the distance of that point or region from the first face (surface). When there is a point (or region) Z1 of which the distance (depth) from the first face is d1, and a point (or region) Z2 of which the distance (depth) from the first face is d2, and d1>d2 holds, this may be expressed as "Z1 is deeper than Z2", or "Z2 is shallower than Z1". Further, when there is a point (or region) Z3 of which the distance (depth) from the first face is d3, and d1>d3>d2 holds, this may be expressed as "Z3 is at a depth between Z1 and Z2", "Z3 is between Z1 and Z2 with respect to the depth direction", or the like.

In the following description, the anodes of the APDs are of fixed potential, and signals are retrieved from a cathode side. Accordingly, a first conducting type semiconductor region in which a charge of the same polarity as a signal charge is the majority carrier is an n-type semiconductor region, and a second conducting type semiconductor region in which a charge of the opposite polarity as to the signal charge is the majority carrier is a p-type semiconductor region. Note that the technology according to the present disclosure will function even in a case of setting the cathodes of the APDs to fixed potential and retrieving signals from the anode side. In this case, a first conducting type semiconductor region in which a charge of the same polarity as the signal charge is the majority carrier is the p-type semiconductor region, and a second conducting type semiconductor region in which a charge of the opposite polarity as to the signal charge is the majority carrier is the n-type semiconductor region. Hereinafter, description will be made regarding a case of one of the nodes of the APDs as being fixed potential, but the potentials of both nodes may vary.

When simply stating "impurity concentration" in the present specification, this means the net impurity concentration, with the amount compensated for by inverse conducting type impurity subtracted. That is to say, "impurity concentration" indicates the net doping concentration. A region in which a doped impurity concentration of p-type dopant is higher than a doped impurity concentration of n-type dopant is a p-type semiconductor region. Conversely, a region in which the doped impurity concentration of n-type dopant is higher than the doped impurity concentration of p-type dopant is an n-type semiconductor region.

First, a configuration that is common to the Examples will be described with reference to FIGS. 1 to 5.

FIG. 1 is a diagram illustrating a configuration of a photoelectric conversion device 100 that is a stacked-type photoelectric conversion device. The photoelectric conversion device 100 is configured by two members, a first member 11 and a second member 21, being stacked and also electrically connected. The first member 11 has a first semiconductor layer that has a photoelectric conversion element 102 that will be described later, and a first wiring structure. The second member 21 has a second semiconductor layer that has circuits such as a signal processing unit 103 that will be described later, and so forth, and a second wiring structure. The photoelectric conversion device 100 made up of the second semiconductor layer, the second wiring structure, the first semiconductor structure, and the first wiring structure, stacked up in that order. The photoelectric conversion device 100 is a back-illuminated type photoelectric conversion device to which light enters from the second face and the second member 21 is disposed on the first face side. Note that the technology according to the embodiment and the Examples is also applicable to a photoelectric conversion device having a front-illuminated type structure, and also is applicable to a single-layer photoelectric conversion device rather than a stacked type.

Hereinafter, description will be made in which the first member 11 and the second member 21 are diced chips, but the members are not limited to chips. For example, the members may be wafers. Also, the members may be stacked in a wafer state and thereafter diced, or formed into chips from a wafer state, following which first member chips and second member chips are joined.

A pixel region 12 having sensor functions is disposed on the first member 11. Accordingly, the first member 11 may be referred to as a sensor member, a sensor substrate, a sensor chip, or the like. A circuit region 22 that processes the signals detected at the pixel region 12 is disposed on the second member 21. The second member 21 may be referred to as a circuit member, a circuit substrate, a circuit chip, or the like.

Figure 2:
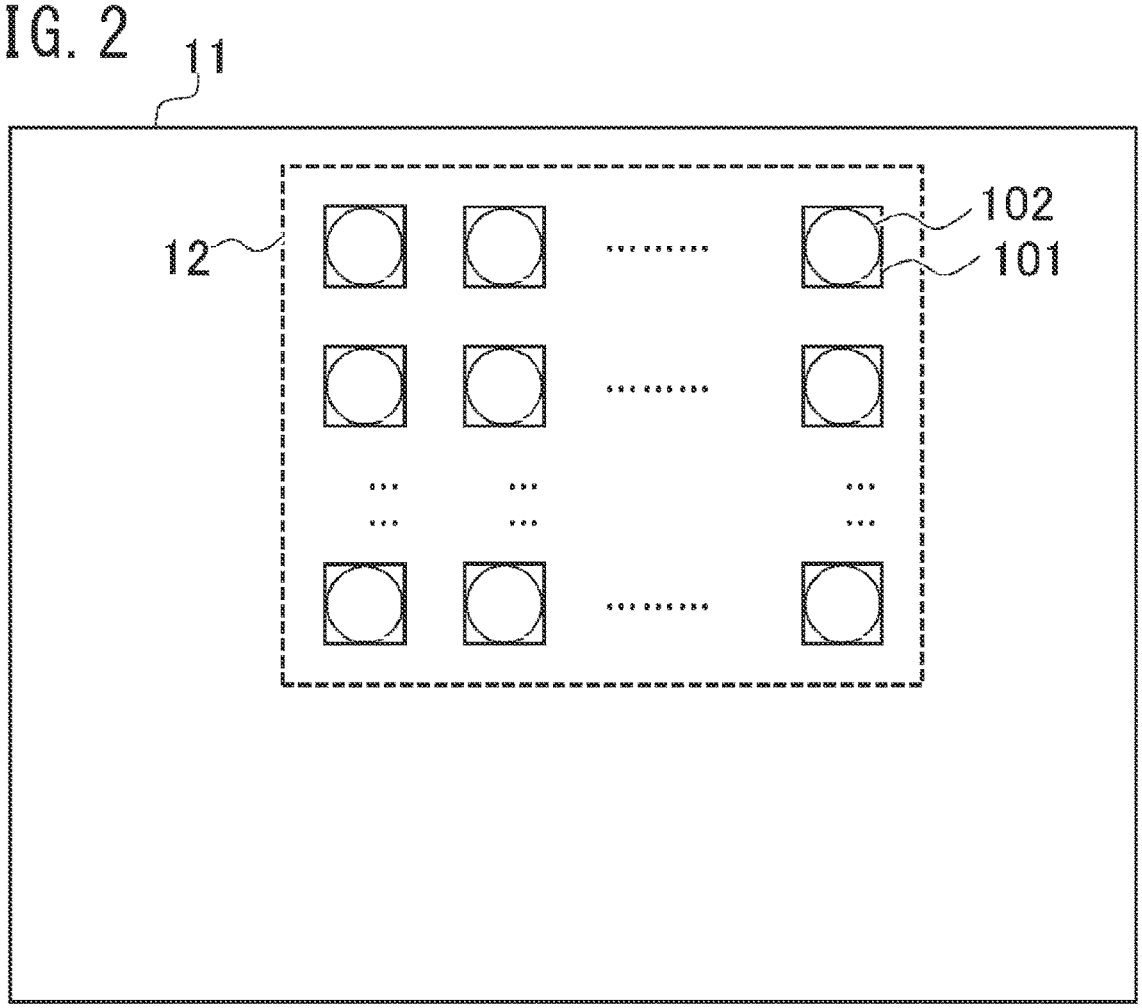
FIG. 2 is a schematic diagram of a sensor substrate of the photoelectric conversion device.

FIG. 2 is a diagram illustrating a layout example of the first member 11. Pixels 101 that have the photoelectric conversion element 102 including an APD are arrayed in a two-dimensional array in plan view, thereby making up the pixel region 12. Note that a right-left direction in FIG. 2 will be referred to as "row direction", "horizontal direction", "x direction", or the like, and an up-down direction in FIG. 2 will be referred to as "column direction", "vertical direction", "y direction", or the like. Also, a direction perpendicular to the plane of the Figure in FIG. 2 will be referred to as "depth direction", "z direction", or the like.

The pixels 101 typically are pixels for forming images, but in a case of using in time of flight (ToF) applications, images do not necessarily have to be formed. That is to say, the pixels 101 may be for measuring the time of light arriving and the amount of light.

Figure 3:
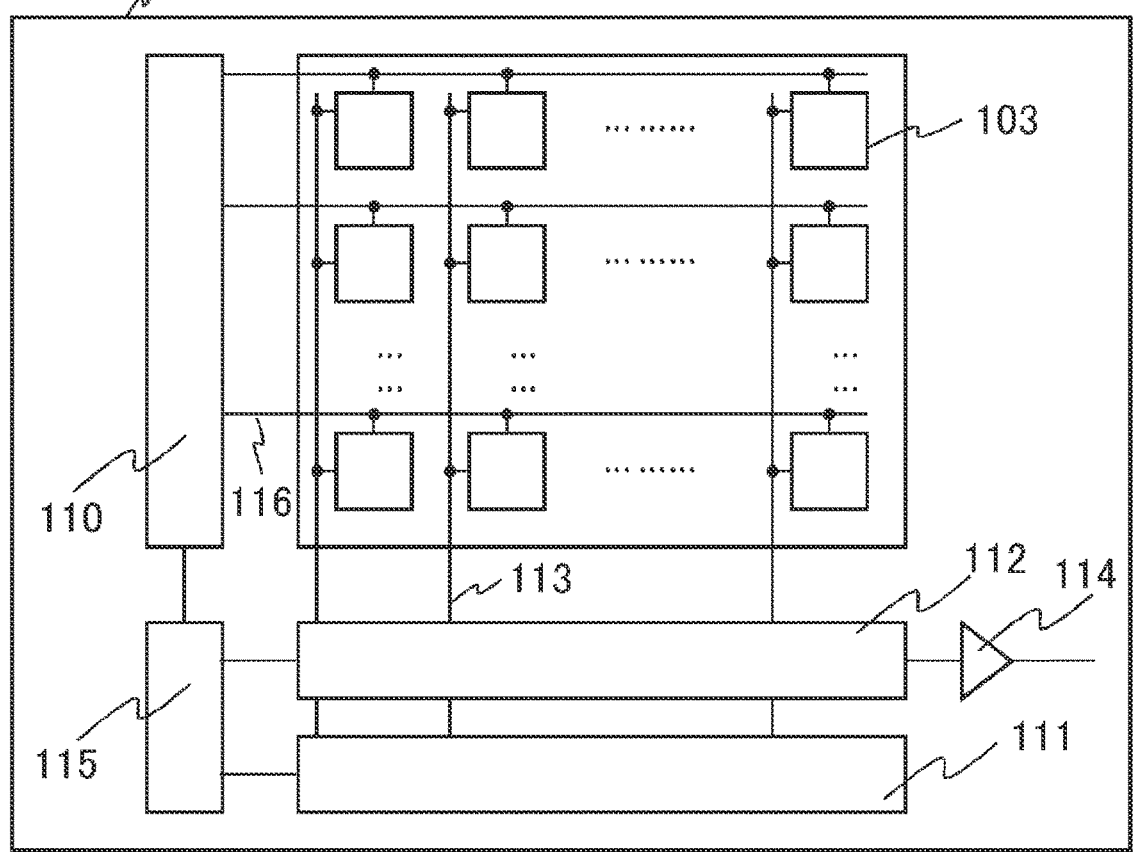
FIG. 3 is a schematic diagram of a circuit substrate of the photoelectric conversion device.

FIG. 3 is a configuration diagram of the second member 21. The second member 21 includes the signal processing unit 103 that processes charges from photoelectric conversion at the photoelectric conversion element 102 in FIG. 2, a read circuit 112, a control pulse generating unit 115, a horizontal scan circuit unit 111, signal lines 113, a vertical scan circuit unit 110, and drive lines 116.

The photoelectric conversion element 102 in FIG. 2 and the signal processing unit 103 in FIG. 3 are electrically connected via connecting wiring provided for each pixel.

The vertical scan circuit unit 110 receives control pulses supplied from the control pulse generating unit 115, and supplies the control pulses to each of the pixels via the drive lines 116. A logic circuit such as a shift register, address decoder, or the like, is used for the vertical scan circuit unit 110.

Signals output from the photoelectric conversion elements 102 of the pixels are processed at the signal processing units 103. The signal processing units 103 are each provided with a counter, memory, and so forth, and digital values are held in the memory.

The horizontal scan circuit unit 111 inputs control pulses for sequentially selecting the columns to the signal processing unit 103, in order to read signals from the memory in each pixel holding digital signals.

Signals regarding the selected column are output from the signal processing units 103 of the pixels selected by the vertical scan circuit unit 110 to the signal lines 113.

Signals output to the signal line 113 are output to a recording unit or a signal processing unit that is outside of the photoelectric conversion device 100, via an output circuit 114.

In FIG. 2, the layout of the photoelectric conversion elements in the pixel region may be disposed in a one-dimensional manner. The functions of the signal processing units do not necessarily need to be provided to each one of all of the photoelectric conversion elements, and for example, an arrangement may be made in which one signal processing unit is shared by a plurality of the photoelectric conversion elements, and signal processing is performed sequentially.

As illustrated in FIGS. 2 and 3, a plurality of the signal processing units 103 are disposed in a region overlaying the pixel region 12 in plan view. Further, the vertical scan circuit unit 110, the horizontal scan circuit unit 111, the read circuit 112, the output circuit 114, and the control pulse generating unit 115 are disposed so as to be overlaid between an edge of the first member 11 and an edge of the pixel region 12 in plan view. In other words, the first member 11 has the pixel region 12, and a non-pixel region disposed around the pixel region 12. The vertical scan circuit unit 110, the horizontal scan circuit unit 111, the read circuit 112, the output circuit 114, and the control pulse generating unit 115 are disposed in a region overlaying the non-pixel region in plan view.

FIG. 4 is an example of a block diagram including an equivalence circuit of FIGS. 2 and 3. In FIG. 4, a photoelectric conversion element 102 that has an APD 201 is provided in the first member 11, and the other members are provided in the second member 21.

The APD 201 generates charge pairs in accordance with incident light, by photoelectric conversion. A voltage VL (first voltage) is supplied to the anode of the APD 201. Also, a voltage VH (second voltage) that is higher than the voltage VL supplied to the anode is supplied to the cathode of the APD 201. A reverse bias voltage is supplied to the anode and the cathode so that the APD 201 performs avalanche multiplication operations. Due to this state in which such a voltage is supplied, charges generated by incident light cause avalanche multiplication, and an avalanche current is generated.

Note that regarding a case in which a reverse bias voltage is supplied, there is a Geiger mode operating in a state in which the potential difference between the anode and the cathode is greater than breakdown voltage, and a linear mode operating in a state in which the potential difference between the anode and the cathode is around or no more than breakdown voltage.

An APD that operates in Geiger mode is called a single-photon avalanche diode (SPAD). For example, the voltage VL (first voltage) is −30 V, and the voltage VH (second voltage) is 1 V. The APD 201 may be operated in linear mode, or may be operated in Geiger mode. In a case of a SPAD, the potential difference as compared to an APD in linear mode is great and the effects of voltage withstanding are markedly pronounced. Accordingly, a SPAD is preferable.

A quenching element 202 is connected to a power supply that supplies the voltage VH, and to the APD 201. The quenching element 202 functions as a load circuit (quenching circuit) at the time of signal multiplication due to avalanche multiplication, and acts to suppress the avalanche multiplication by suppressing voltage supplied to the APD 201 (quenching operations). The quenching element 202 also acts to return the voltage supplied to the APD 201 to the voltage VH, by causing a current corresponding to the voltage drop due to the quenching operation to flow (recharging operation).

The signal processing unit 103 has a waveform shaping unit 210, a counter circuit 211, and a selecting circuit 212. In the present specification, it is sufficient for the signal processing unit 103 to have any one of the waveform shaping unit 210, the counter circuit 211, and the selecting circuit 212.

The waveform shaping unit 210 performs shaping of change in the potential at the cathode of the APD 201 that is obtained when detecting photons, and outputs pulse signals. An inverter circuit, for example, is used as the waveform shaping unit 210. Although an example of using one inverter as the waveform shaping unit 210 is illustrated in FIG. 4, a circuit in which a plurality of inverters are serially connected may be used, or some other circuit that has waveform shaping effects may be used.

The counter circuit 211 counts the pulse signals output from the waveform shaping unit 210, and holds the count value thereof. Also, when a control pulse pRES is supplied via a drive line 213, the signals held in the counter circuit 211 are reset.

Control pulses pSEL are supplied to the selecting circuit 212 from the vertical scan circuit unit 110 in FIG. 3, via a drive line 214 in FIG. 4, thereby switching electrical connection and non-connection of the counter circuit 211 and the signal lines 113. The selecting circuit 212 includes a buffer circuit for outputting signals, for example, and so forth.

Switches such as transistors or the like may be disposed between the quenching element 202 and the APD 201, and between the photoelectric conversion element 102 and the signal processing unit 103, for switching of electrical connection. In the same way, the supply of the voltage VH or the voltage VL supplied to the photoelectric conversion element 102 may be electrically switched using a switch such as a transistor or the like.

A configuration using the counter circuit 211 is illustrated in the present embodiment. However, the photoelectric conversion device 100 may acquire pulse detection timing using a time-to-digital converting circuit (time-to-digital converter, hereinafter "TDC") and memory, instead of the counter circuit 211. At this time, the generation timings of pulse signals output from the waveform shaping unit 210 are converted into digital signals by the TDC. Control pulses pREF (reference signals) are supplied to the TDC from the vertical scan circuit unit 110 in FIG. 3 via the drive line 213, for measurement of timings of pulse signals. The TDC acquires signals regarding which the input timings of signals output from the pixels via the waveform shaping unit 210 are relative time, as digital signals, with the control pulse pREF as a reference.

Figure 5A:
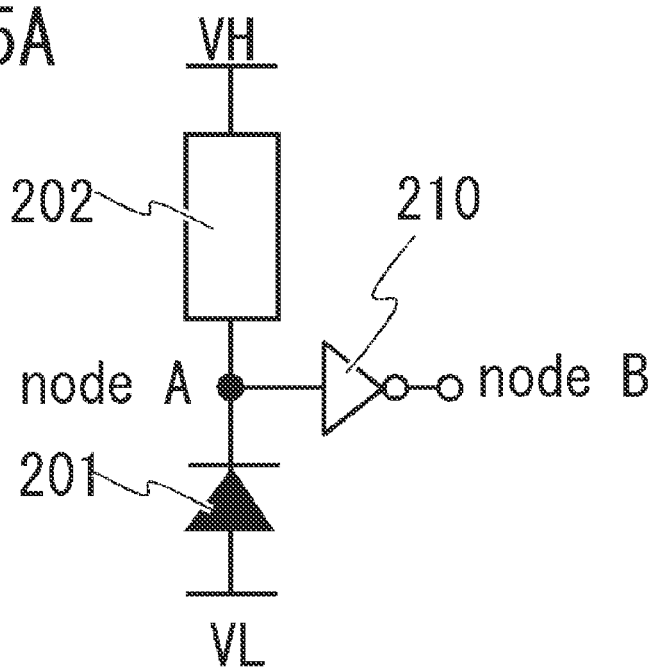
FIGS. 5A and 5B are schematic diagrams illustrating driving of the pixel circuit of the photoelectric conversion device.
Figure 5B:
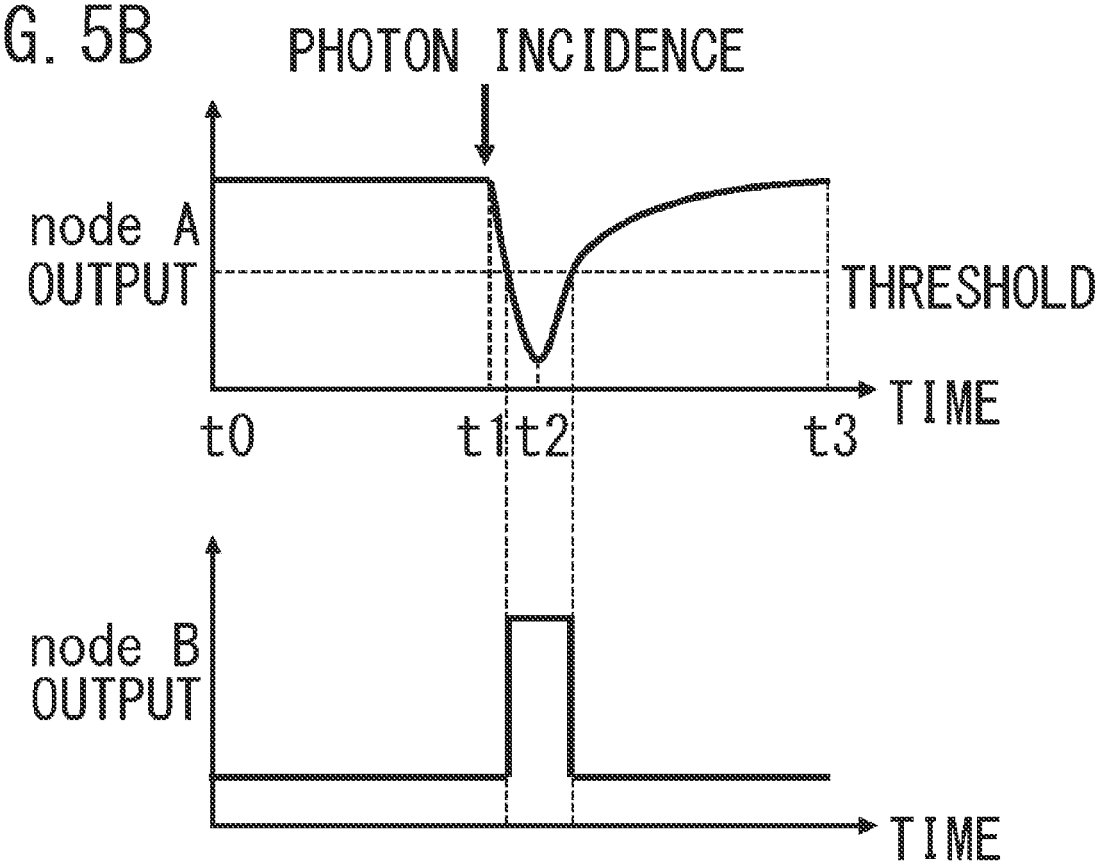

FIGS. 5A and 5B schematically illustrate the relation between APD operations and output signals. FIG. 5A is a diagram in which the APD 201, the quenching element 202, and the waveform shaping unit 210 are extracted from FIG. 4. An input side of the waveform shaping unit 210 will be referred to as node A, and an output side as node B. The upper side in FIG. 5B indicates waveform change at node A, and the lower side indicates waveform change at node B, respectively.

Potential difference of VH-VL is applied to the APD 201 from time t0 to time t1. Upon photons entering the APD 201 at time t1, avalanche multiplication occurs in the APD 201, an avalanche multiplication current flows to the quenching element 202, and the voltage at node A drops. When the voltage drop further increases and the potential difference applied to the APD 201 becomes small, the avalanche multiplication at the APD 201 ceases as shown at time t2, and the voltage level at the node A does not drop to a certain value or lower. Thereafter, during time t2 to time t3, current compensating for the drop in voltage flows from voltage VL to the node A, and at time t3 the node A becomes statically determinate at the original potential level. At this time, the portion at which the output waveform at the node A exceeded a certain threshold value is subjected to waveform shaping at the waveform shaping unit 210, and is output as a signal at the node B.

Note that the layout of the signal lines 113, the read circuit 112, and the output circuit 114 is not limited to that in FIG. 3. For example, the signal lines 113 may be disposed extending in the row direction, with the read circuit 112 disposed in the direction to which the signal lines 113 extend.

Photoelectric conversion devices according to the Examples will be described below.

EXAMPLE 1

Figure 6:
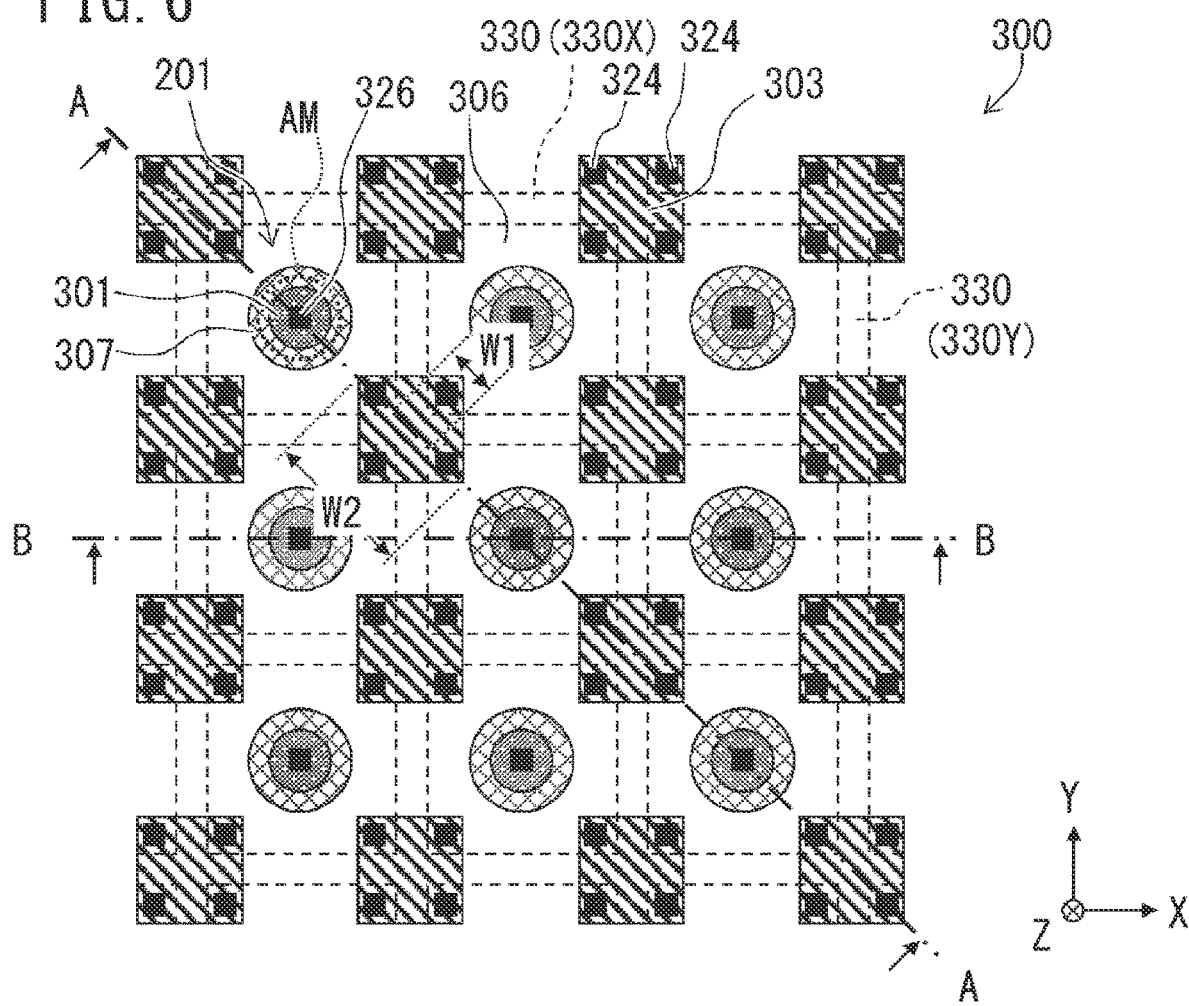
FIG. 6 is a plan view of a photoelectric conversion device according to Example 1.
Figure 7:
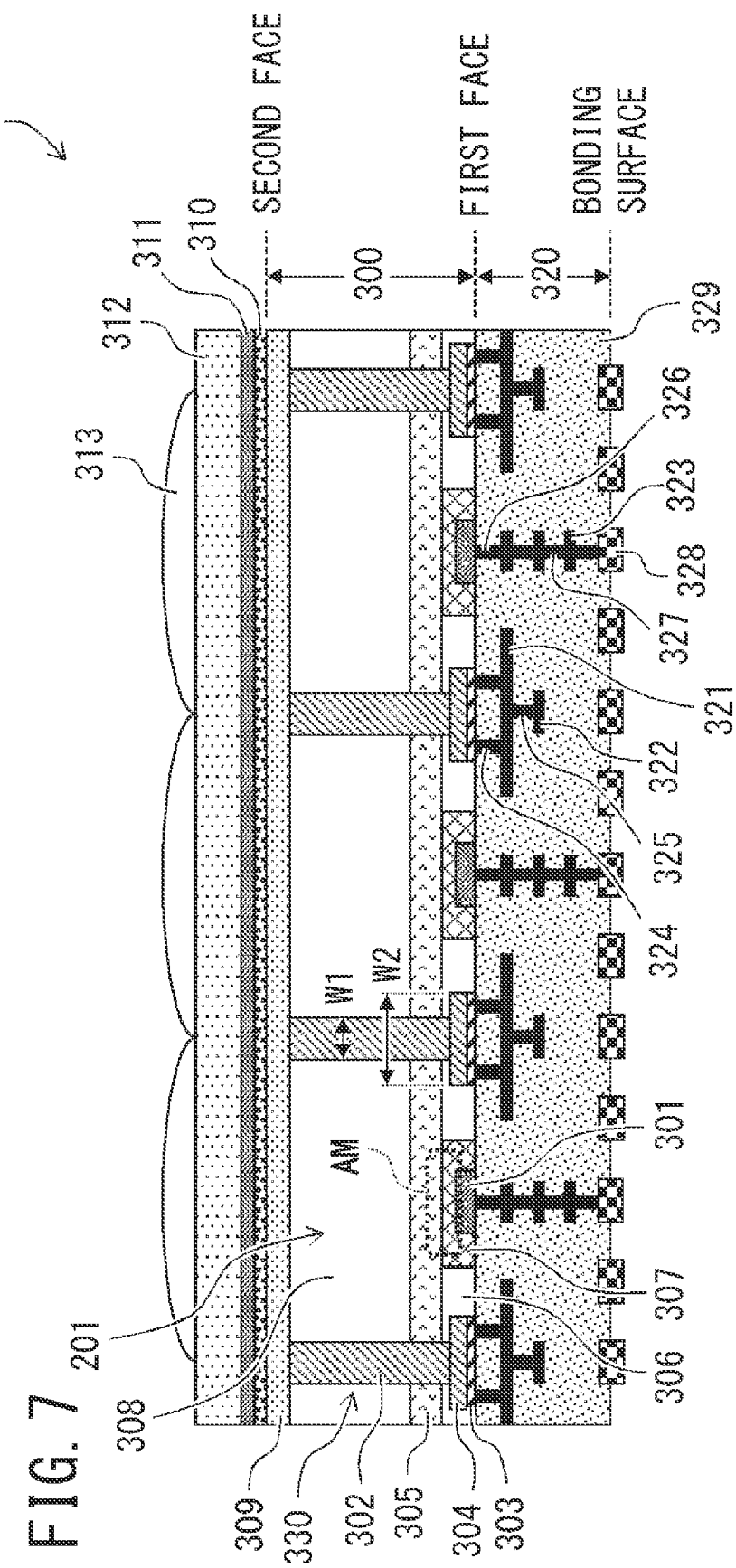
FIG. 7 is a cross-sectional view of the photoelectric conversion device according to Example 1, taken along a diagonal direction.
Figure 8:
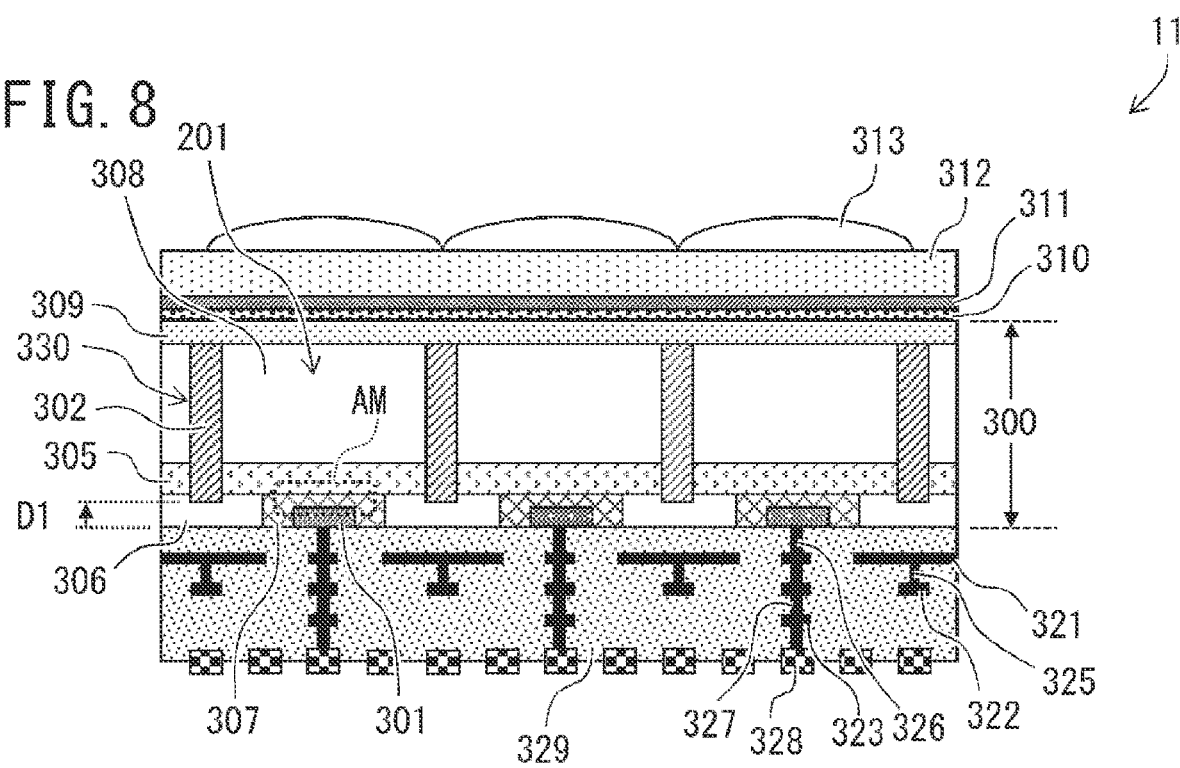
FIG. 8 is a cross-sectional view of the photoelectric conversion device according to Example 1, taken along a midsegment direction.

FIGS. 6, 7, and 8 illustrate the structure of the first member 11 (sensor substrate) of a photoelectric conversion device according to Example 1. FIG. 6 is a plan view illustrating a configuration of the pixel region, schematically illustrating a semiconductor layer 300 of the first member 11 as viewed from the first face side. FIG. 7 is a cross-sectional view taken along line A-A (diagonal direction) in FIG. 6, and FIG. 8 is a cross-sectional view taken along line B-B (midsegment direction) in FIG. 6.

As illustrated in FIG. 6, in the semiconductor layer 300, a plurality of the APDs 201 are laid out in a two-dimensional array in the row direction (right-left direction in FIG. 6) and the column direction (up-down direction in FIG. 6). In FIG. 6, only three rows by three columns for a total of nine APDs 201 are illustrated for the sake of convenience of illustration, but in an actual product, hundreds of thousands to millions of the APDs 201 will be formed, for example. One APD 201 corresponds to one pixel.

An isolation portion 330 that is an isolation structure is provided to the semiconductor layer 300, in order to reduce crosstalk among adjacent APDs 201. The isolation portion 330 is made up of a plurality of row-direction isolation portions 330X extending in the row direction, and a plurality of column-direction isolation portions 330Y extending in the column direction, in a grid form. An APD 201 is disposed in each section that is sectioned by the isolation portion 330 that has a grid form. In the present Example, the sections corresponding to one pixel have a substantially square shape in plan view. The boundaries of the sections are provided to overlay the isolation portion 330, for example. Contact plugs 326 of cathode wiring formed in a wiring structure 320 are disposed substantially at the middle of the pixels (sections), and contact plugs 324 of anode wiring are disposed at positions of the four corners of the pixels. That is to say, in the present Example, four contact plugs 324 of anode wiring are provided for one pixel.

As illustrated in FIGS. 7 and 8, the first member 11 (sensor substrate) is a structure in which the semiconductor layer 300 and the wiring structure 320 are stacked. A face of the semiconductor layer 300 toward the wiring structure 320 will be referred to as the first face, and a face on the side opposite from the first face as the second face. The semiconductor layer 300 is made of silicon, for example. A fixed charge film 310, an insulating film 311, a planarizing film 312, and so forth, are stacked in order on the second face of the semiconductor layer 300, and further, microlenses 313 corresponding to the pixels are provided thereupon. That is to say, the photoelectric conversion device according to the present Example has a so-called back-illuminated type structure in which light enters the semiconductor layer 300 from the second face side. The second face may also be referred to as a face of optical incidence. Also, the following structure can be applied to the face of optical incidence. For example, uneven structures, such as at least one or more depressed portions or protruded portions, are disposed on the second face that is the face of optical incidence. The uneven structures are made up of members other than the silicon that makes up the semiconductor layer 300. For example, an insulator such as a silicon oxide film, a silicon oxynitride film, a silicon nitride film, or the like, is disposed in the depressed portions provided in the semiconductor layer 300. An interface with refractive index difference that is not parallel to the second face is formed. Such a structure causes diffraction of incident light, and accordingly sensitivity to light in the infrared region can be improved.

The fixed charge film 310 is made up of a dielectric substance that has a negative fixed charge, and is disposed on the entire second face of the semiconductor layer 300. Examples of materials that can be selected for the fixed charge film 310 include hafnium oxide, aluminum oxide, zirconium oxide, titanium oxide, tantalum oxide, and ruthenium oxide, with aluminum oxide or hafnium oxide being particularly preferable. The fixed charge film 310 may have a configuration that is made up of a plurality of layers. The insulating film 311 is disposed upon the fixed charge film 310, over the entire second face. Examples of materials that can be suitably used for the insulating film 311 include a silicon oxide film, a silicon oxynitride film, and a silicon nitride film. The insulating film 311 may have a configuration that is made up of a plurality of layers. Note that a filter layer such as a color filter or an infrared cut-off filter, may be provided on the second face side of the semiconductor layer 300 in addition to the planarizing film 312, although omitted from illustration.

The wiring structure 320 is a structure in which a plurality of layers of wiring 321, 322, and 323, via plugs 325 and 327 that connect between the wiring, the contact plugs 324 for anode wiring, the contact plugs 326 for cathode wiring, and so forth, are disposed within an insulating layer 329. The lower side face of the wiring structure 320 (the opposite side from the semiconductor layer 300) is a bonding surface for bonding the wiring structure 320 to the second member 21, and a plurality of bonding portions 328 are provided on the bonding surface.

The semiconductor layer 300 includes a first semiconductor region 301, a second semiconductor region 302, a third semiconductor region 303, a fourth semiconductor region 304, a fifth semiconductor region 305, a sixth semiconductor region 306, a seventh semiconductor region 307, an eighth semiconductor region 308, and a ninth semiconductor region 309. The semiconductor regions each are a region doped with an impurity by ion injection, or a region in which an impurity has been added at the time of fabrication or epitaxial growth of the semiconductor substrate. Here, the first semiconductor region 301, the sixth semiconductor region 306, the seventh semiconductor region 307, and the eighth semiconductor region 308 are semiconductor regions of the first conducting type (n-type in the present Example). The second semiconductor region 302, the third semiconductor region 303, the fourth semiconductor region 304, the fifth semiconductor region 305, and the ninth semiconductor region 309 are semiconductor regions of the second conducting type (p-type in the present Example).

The first semiconductor region 301 is a semiconductor region of the first conducting type (n-type in the present Example), and is provided on the first face of the semiconductor layer 300. The first semiconductor region 301 in the present Example is circularly formed at the middle portion of the pixel (section) in plan view, as illustrated in FIG. 6. The contact plug 326 of the cathode is connected to the center position of the first semiconductor region 301.

The fifth semiconductor region 305 is a semiconductor region of the second conducting type (p-type in the present Example), and is provided on the further toward the incident side of light (side closer to the second face) than the first semiconductor region 301. The fifth semiconductor region 305 is formed as a layer at a predetermined thickness, so as to divide an epitaxial layer of the first conducting type in one pixel (section) into above and below. The periphery of the fifth semiconductor region 305 comes into contact with the isolation portion 330 surrounding the pixel. The epitaxial layer of the first conducting type that is further toward the first face side than the fifth semiconductor region 305 is the sixth semiconductor region 306, and the epitaxial layer of the first conducting type that is on the second face side thereof is the eighth semiconductor region 308.

The first semiconductor region 301 of the first conducting type and the fifth semiconductor region 305 of the second conducting type form an avalanche multiplication portion AM by a p-n junction. Signal charges generated within the eighth semiconductor region 308 by photoelectric conversion are collected at the avalanche multiplication portion AM. In order to improve the sensitivity of the APD 201, the size of the eighth semiconductor region 308 that corresponds to a sensitivity region is preferably large.

The seventh semiconductor region 307 is a semiconductor region of the first conducting type that is formed at the periphery of the first semiconductor region 301. The seventh semiconductor region 307 is also circularly formed in plan view. The impurity concentration of the first semiconductor region 301, the seventh semiconductor region 307, and the sixth semiconductor region 306 is set to satisfy the relation of "first semiconductor region 301>seventh semiconductor region 307>sixth semiconductor region 306" here. That is to say, the impurity concentration of the first semiconductor region 301 is the highest, and the impurity concentration of the seventh semiconductor region 307 is set so as to be a concentration between that of the first semiconductor region 301 and the sixth semiconductor region 306. Thus, electrical connection between the cathode and the first semiconductor region 301 (i.e., the APD 201) can be secured. Also, the seventh semiconductor region 307 has a role of a guard ring for electric field mitigation.

The ninth semiconductor region 309 is an embedded layer of the second conducting type, provided over the entire second face of the semiconductor layer 300. The ninth semiconductor region 309 has a role of suppressing noise from the second face side. Also, the voltage VL from the anode wiring can be supplied to the ninth semiconductor region 309 via the second semiconductor region 302. In this case, a potential gradient for collecting charges can be formed.

The isolation portion 330 according to the present Example is formed by the second semiconductor region 302 of the second conducting type, and controls movement of electrons between pixels by a potential barrier. In terms of the depth direction from the first face, the second semiconductor region 302 is provided from a position of a predetermined depth D1 to a position coming into contact with the ninth semiconductor region 309, as illustrated in FIG. 8. By keeping the second semiconductor region 302 to the position of the depth D1, so as not to be exposed at the first face, charges (noise) generated near the first face can be prevented from traveling through the semiconductor region of the second conducting type and intruding into the sensitivity region. Now, the depth D1 (the position of the end of the second semiconductor region 302 on the first face side) is a position that is shallower than the fifth semiconductor region 305. In other words, the second semiconductor region 302 of the isolation portion 330 preferably is disposed so as to isolate adjacent pixels from each other with respect to at least the eighth semiconductor region 308 that is a sensitivity region, and the fifth semiconductor region 305 forming the avalanche multiplication portion AM. The second semiconductor region 302 can be said to be situated between at least a plurality of the avalanche multiplication portions AM.

Connecting portions (303, 304) for electrically connecting between the contact plug 324 of the anode wiring and the second semiconductor region 302 of the isolation portion 330 are provided on the first face of the semiconductor layer 300. The connecting portions in the present Example are made up of the third semiconductor region 303 connected to the contact plug 324, and the fourth semiconductor region 304 that is disposed between this third semiconductor region 303 and the second semiconductor region 302. The second semiconductor region 302, the third semiconductor region 303, and the fourth semiconductor region 304 are each of the second conducting type (p-type in the present Example), and the impurity concentrations thereof are set such that the relations of "third semiconductor region 303>second semiconductor region 302" and "third semiconductor region 303>fourth semiconductor region 304" are satisfied. That is to say, the impurity concentration of the third semiconductor region 303 is the highest. Specifically, the impurity concentration of the third semiconductor region 303 is preferably higher than the impurity concentrations of the second semiconductor region 302 and the fourth semiconductor region 304 by one digit or more. This enables a stable ohmic junction to be realized between the contact plug 324 of the anode wiring and the third semiconductor region 303. Also, by setting the impurity concentration of the fourth semiconductor region 304 to be low, a minimum of potential can be formed at the depth of the fourth semiconductor region 304, and charges (noise) generated on the contact plug 324 can be suppressed from intruding into the sensitivity region (detailed description later).

While the relation of impurity concentration between the second semiconductor region 302 and the fourth semiconductor region 304 is optional, the impurity concentration of the fourth semiconductor region 304 is suitably set to the same value as the impurity concentration of the second semiconductor region 302 or a lower value. That is to say, satisfying the relation of "third semiconductor region 303»second semiconductor region 302>fourth semiconductor region 304" is preferable. For example, the impurity concentration of the third semiconductor region 303 is preferably set in the order of 1.0E19 atms/cm$^3$, and the impurity concentrations of the second semiconductor region 302 and the fourth semiconductor region 304 in the order of 1.0E17 to 1.0E18 atms/cm$^3$.

As illustrated in FIG. 6, the connecting portions (303, 304) are disposed at positions corresponding to intersecting portions of the row-direction isolation portions 330X and the column-direction isolation portions 330Y. The semiconductor region of the second conducting type is not exposed to the first face at regions other than the connecting portions (third semiconductor region 303).

The contact plugs 324 of the anode wiring are disposed at the four corners of the section of one pixel in plan view, at positions distanced from the intersecting portions of the isolation portion 330 by a predetermined distance. The third semiconductor region 303 has a footprint that is one size larger than a bounding rectangle of the four contact plugs 324, for physical and electrical contact with the four contact plugs 324 disposed around one intersecting portion. The shape of the footprint (the planar shape when projected on the first face) of the third semiconductor region 303 according to the present Example is substantially a square.

In plan view in FIG. 6, two APDs 201 arrayed in the diagonal direction (first direction) are at symmetrical positions across the intersecting portion of the isolation portion 330 and the third semiconductor region 303. The sizes of the isolation portion 330 and the third semiconductor region 303 are set such that a width W1 of the isolation portion 330 (intersecting portion) is smaller than a width W2 of the third semiconductor region 303 (connecting portion) when compared with respect to width in this first direction, as illustrated in FIGS. 6 and 7.

According to such a configuration, the width of the isolation portion 330 in plan view can be maximally reduced, and accordingly distance between the isolation portion 330 and the avalanche multiplication portion AM can be sufficiently secured even in a case of minimizing the pixel size. Thus, miniaturization (high-definition) of pixels and suppression of DCR can both be realized, while maintaining inter-pixel separation performance. Also, by reducing the width of the isolation portion 330 that is a dead region, the size of the sensitivity region can be increased relatively, and the aperture ratio of the pixel can be increased. Accordingly, the sensitivity of the photoelectric conversion device can be improved. At the same time, with regard to the third semiconductor region 303 for connecting the isolation portion 330 and the anode wiring, the third semiconductor region 303 is formed broader as compared to the isolation portion 330, and the impurity concentration thereof is higher than that of the second semiconductor region 302 of the isolation portion 330. Accordingly, a stable ohmic junction can be realized with the anode wiring.

Also, the fourth semiconductor region 304 has the same footprint as the third semiconductor region 303, and the width of the fourth semiconductor region 304 in the first direction is also the same W2 as the width of the third semiconductor region 303. Making the footprint shape to be the same in this way enables the third semiconductor region 303 and the fourth semiconductor region 304 to be fabricated using the same mask when manufacturing the semiconductor layer 300, which is advantageous in that manufacturing is simplified. Note however, that making the footprint shape and width of the third semiconductor region 303 and the fourth semiconductor region 304 to be the same is not indispensable, and the footprint shape and width of the fourth semiconductor region 304 may be made to be smaller than those of the third semiconductor region 303. For example, the footprint shape and width of the fourth semiconductor region 304 may be made to match those of the intersecting portion of the isolation portion 330.

Figure 9:
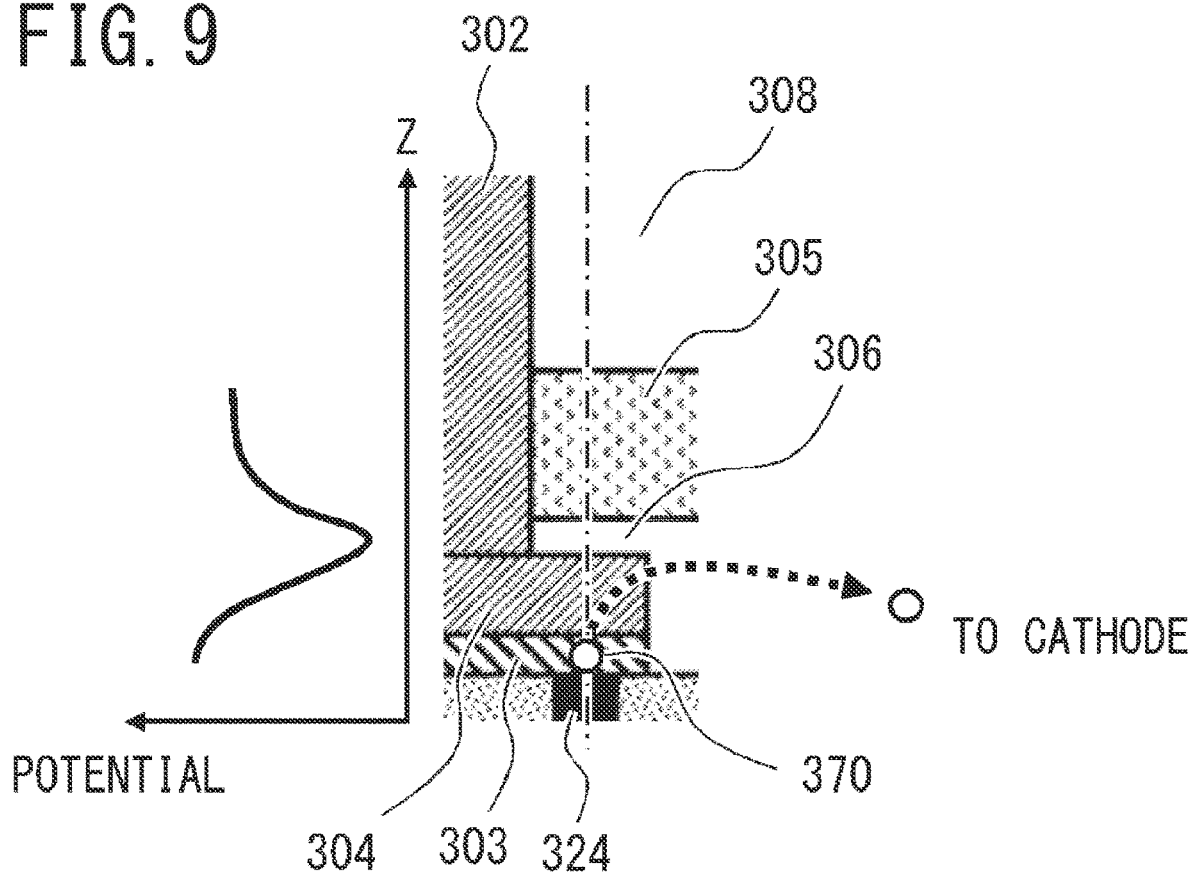
FIG. 9 is an enlarged view of principal portions of the photoelectric conversion device according to Example 1.

FIG. 9 is an enlarged diagram of principal portions in FIG. 7, schematically illustrating that layer structure of the semiconductor region directly above the contact plug 324 of the anode wiring and the potential thereof. Directly above the contact plug 324 (single-dot chain line in FIG. 9) are disposed the third semiconductor region 303, the fourth semiconductor region 304, the sixth semiconductor region 306, and the fifth semiconductor region 305, in that order from the first face. Now, the third semiconductor region 303, the fourth semiconductor region 304, and the fifth semiconductor region 305 are of the second conducting type (p-type in the present Example), and the sixth semiconductor region 306 interposed therebetween is of the first conducting type (n-type in the present Example). Further, when comparing the third semiconductor region 303 and the fourth semiconductor region 304, the impurity concentration of the fourth semiconductor region 304 is lower by one digit or more. Accordingly, in the region directly above the contact plug 324, a minimum of potential is formed at the depth of the sixth semiconductor region 306.

According to this configuration, even if a charge 370 is generated at the portion of junction with the contact plug 324, the charge 370 is not capable of crossing the minimum of potential, and is collected to the cathode as indicated by the dotted line arrow in FIG. 9. Accordingly, the charges (noise) generated at the junction portion of the anode can be suppressed from intruding to the eighth semiconductor region 308 that is the sensitivity region.

By employing the structure according to the present Example described above, a high-definition and high-performance photoelectric conversion device can be provided.

Note that in the above Example, the sixth semiconductor region 306 is formed of a semiconductor region of the first conducting type that has a lower impurity concentration than the impurity concentration of the first semiconductor region 301, but the sixth semiconductor region 306 is not limited to this configuration. For example, the sixth semiconductor region 306 may be formed of a semiconductor region of the second conducting type that has a lower impurity concentration than the impurity concentration of the fifth semiconductor region 305. In this case, the carrier concentrations making up the first conducting type of the first semiconductor region 301, the seventh semiconductor region 307, and the sixth semiconductor region 306 are set such that the relation of "first semiconductor region 301>seventh semiconductor region 307>sixth semiconductor region 306" is satisfied. Also, the sixth semiconductor region 306 may be a neutral region, for example. In the same way, the eighth semiconductor region 308 may be formed of a semiconductor region of the second conducting type having an impurity concentration that is lower than the impurity concentration of the fifth semiconductor region 305, or may be a neutral region. Also, when the eighth semiconductor region 308 and the sixth semiconductor region 306 are of the first conducting type, the impurity concentrations of the eighth semiconductor region 308 and the sixth semiconductor region 306 may be set such that the relation of "eighth semiconductor region 308>sixth semiconductor region 306" is satisfied.

EXAMPLE 2

Figure 10:
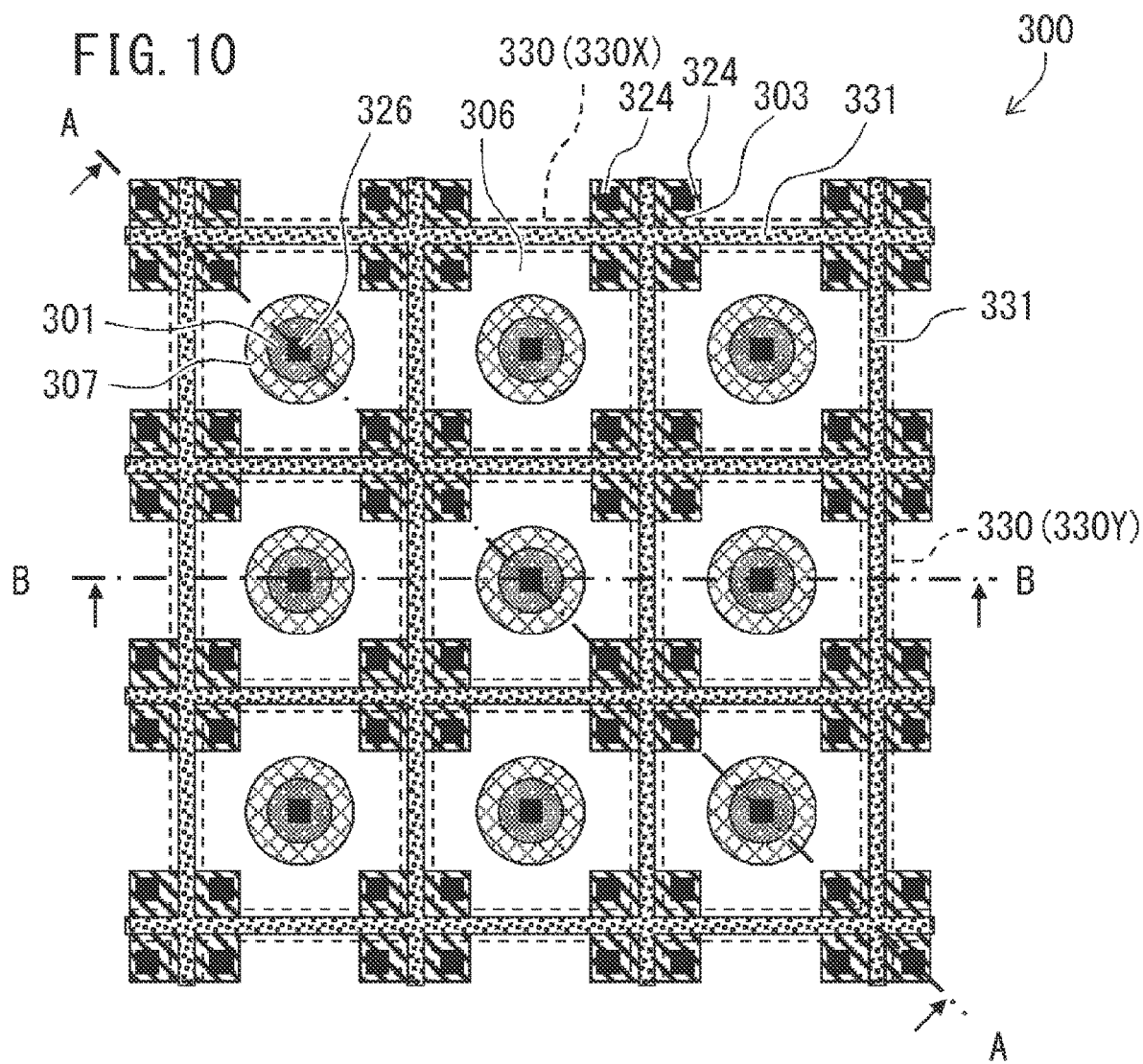
FIG. 10 is a plan view of a photoelectric conversion device according to Example 2.
Figure 11:
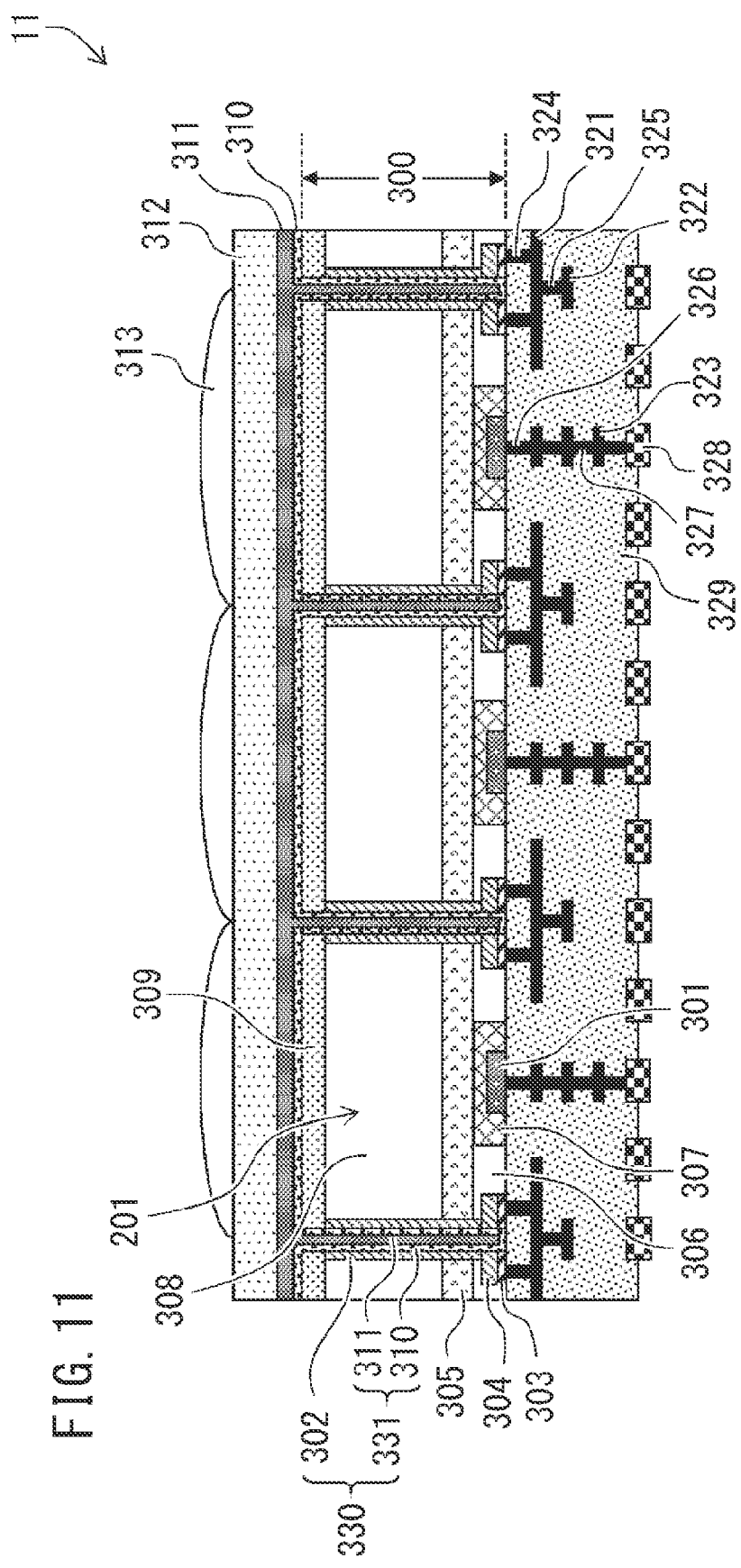
FIG. 11 is a cross-sectional view of the photoelectric conversion device according to Example 2, taken along a diagonal direction.
Figure 12:
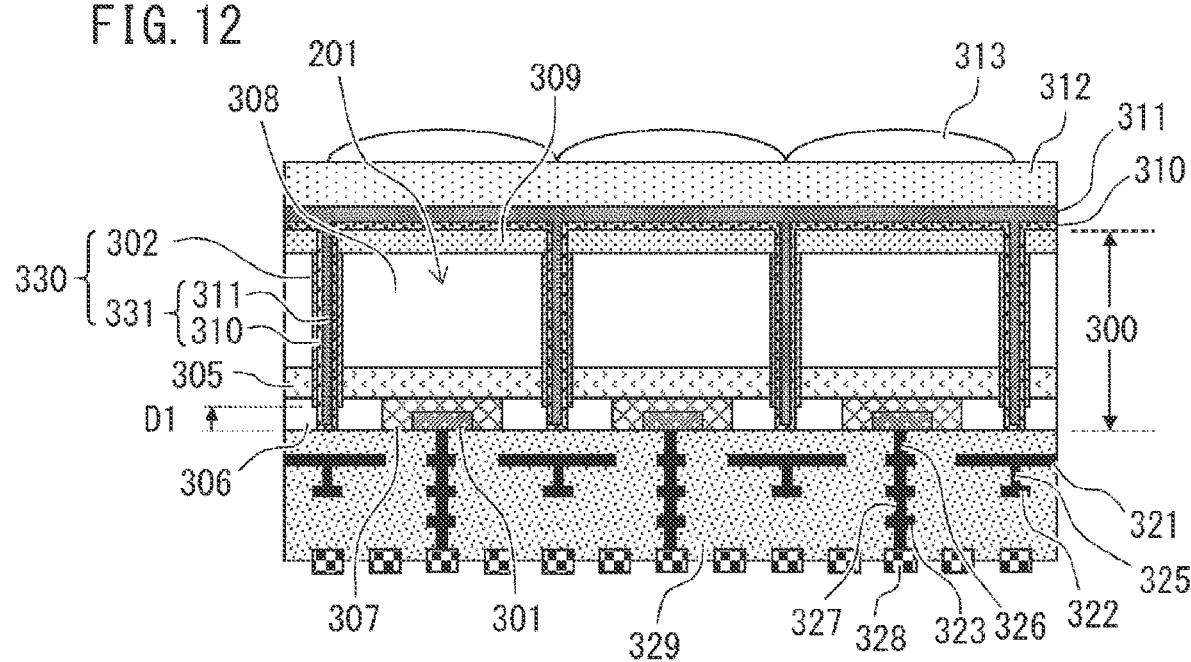
FIG. 12 is a cross-sectional view of the photoelectric conversion device according to Example 2, taken along a midsegment direction.

FIGS. 10, 11, and 12 illustrate the structure of the first member 11 (sensor substrate) of a photoelectric conversion device according to Example 2. FIG. 10 is a plan view illustrating a configuration of the pixel region, schematically illustrating the semiconductor layer 300 of the first member 11 as viewed from the first face side. FIG. 11 is a cross-sectional view taken along line A-A (diagonal direction) in FIG. 10, and FIG. 12 is a cross-sectional view taken along line B-B (midsegment direction) in FIG. 10. Portions that correspond to those in Example 1 are denoted by the same signs. Configurations that are different from those in Example 1 will be described below.

The isolation portion 330 according to the present Example includes a deep trench isolation (DTI) 331 that is an insulator, and the second semiconductor region 302 disposed between the DTI 331 and the APD 201. The DTI 331 according to the present Example includes the insulating film 311, and the fixed charge film 310 disposed between the insulating film 311 and the second semiconductor region 302 of the second conducting type. Examples of materials suitable for the insulating film 311 include a silicon oxide film, a silicon oxynitride film, a silicon nitride film, or the like, and examples of materials suitable for the fixed charge film 310 include an aluminum oxide film, a hafnium oxide film, and so forth. The DTI 331 is fabricated by, for example, forming a groove (trench) that passes through from the second face of the semiconductor layer 300 to the first face, covering inner walls of the groove with the fixed charge film 310, and embedding the insulating film 311.

Operations effects that are the same as those of Example 1 can be obtained by this configuration as well. In addition, the inter-pixel separation performance is further improved by providing the DTI 331, and further suppression of crosstalk can be anticipated. The fixed charge film 310 forms a hole accumulation region, and accordingly effects of suppressing DCR and crosstalk can be further improved.

Also, in the isolation portion 330 according to the present Example, in terms of the depth direction from the first face, the second semiconductor region 302 is provided from a position of a predetermined depth D1 to a position coming into contact with the ninth semiconductor region 309, as illustrated in FIG. 12. That is to say, the second semiconductor region 302 of the second conducting type does not reach the first face. Accordingly, at places where the connecting portions (303, 304) are not present, the first-face side end portion of the DTI 331 is not covered by the semiconductor region of the second conducting type, and is in a state of being in contact with the sixth semiconductor region 306. According to such a configuration, charges (noise) generated near the first face can be prevented from traveling through the semiconductor region of the second conducting type and intruding into the sensitivity region. Now, the depth D1 (the position of the end of the second semiconductor region 302 on the first plane side) is a position that is shallower than the fifth semiconductor region 305.

Note that while the DTI 331 passes through to the first face side in the present Example, a structure may be made in which the DTI 331 is formed to a depth partway through the semiconductor layer 300. For example, a structure may be made in which the DTI 331 and the second semiconductor region 302 are of the same depth, with the bottom portion of the DTI 331 coming into contact with the contact portions (303, 304). Also, a conductor may be embedded within the DTI 331.

EXAMPLE 3

Figure 13:
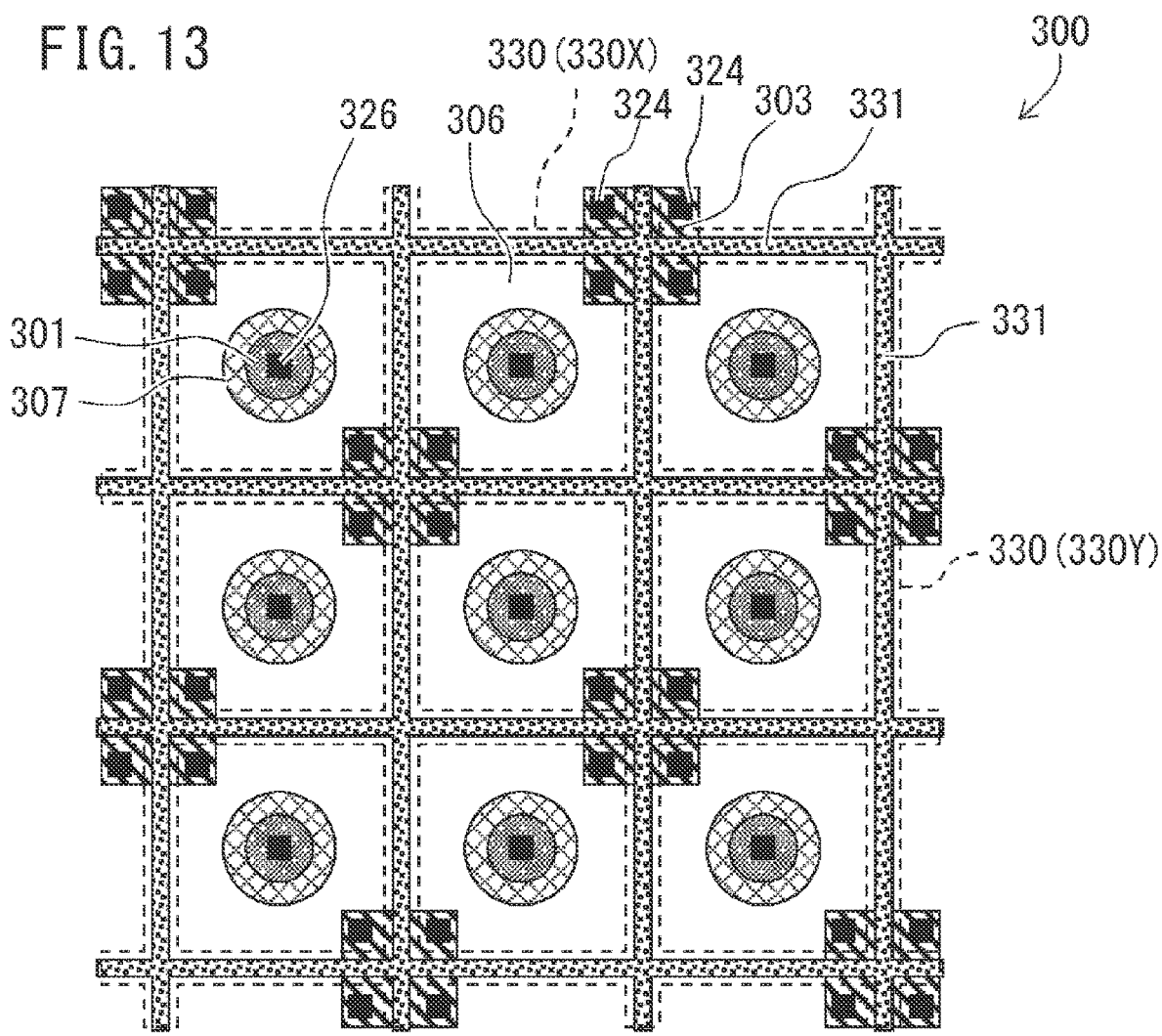
FIG. 13 is a plan view of a photoelectric conversion device according to Example 3.

FIG. 13 schematically illustrates the semiconductor layer 300 of a photoelectric conversion device according to Example 3 as viewed from the first face side. Portions that correspond to those in the Examples described above are denoted by the same signs. Configurations that are different from those in the Examples described above will be described below.

In Example 1 and Example 2, the connecting portions are formed at four intersecting portions corresponding to the four corners of the section of each APD (i.e., at all intersecting portions of the grid-like isolation portion 330). Conversely, the contact plugs 324 and connecting portions of the anode wiring are thinned out in Example 3. Specifically, the contact plugs 324 and connecting portions (third semiconductor region 303 and fourth semiconductor region 304) are disposed only at two intersecting portions corresponding to opposing corners of the section of each APD.

Operations effects that are the same as those of the Examples described above can be obtained by this configuration as well. In addition, reducing the contact portions to the anode, which can be a source of noise generation, enables DCR to be further reduced as well.

Also, the contact plugs 324 are thinned out in the present Example such that the layout of the contact plugs 324 across the row-direction isolation portions 330X is in mirror symmetry, and the layout of the contact plugs 324 across the column-direction isolation portions 330Y is in mirror symmetry. Accordingly, the four contact plugs 324 are assembled surrounding one intersecting portion in this layout, and accordingly the area of the footprint of the connecting portions can be made to be equal to that in Examples 1 and 2. Thus, a stable ohmic junction can be realized with the anode. Also, when the footprint of the connecting portions is small, formation of the mask (resist) becomes difficult, leading to concerns in lower manufacturing yield. However, this problem does not occur with the way of thinning out in the present Example. Accordingly, the configuration according to the present Example is advantageous in miniaturization of pixels.

EXAMPLE 4

Figure 14:
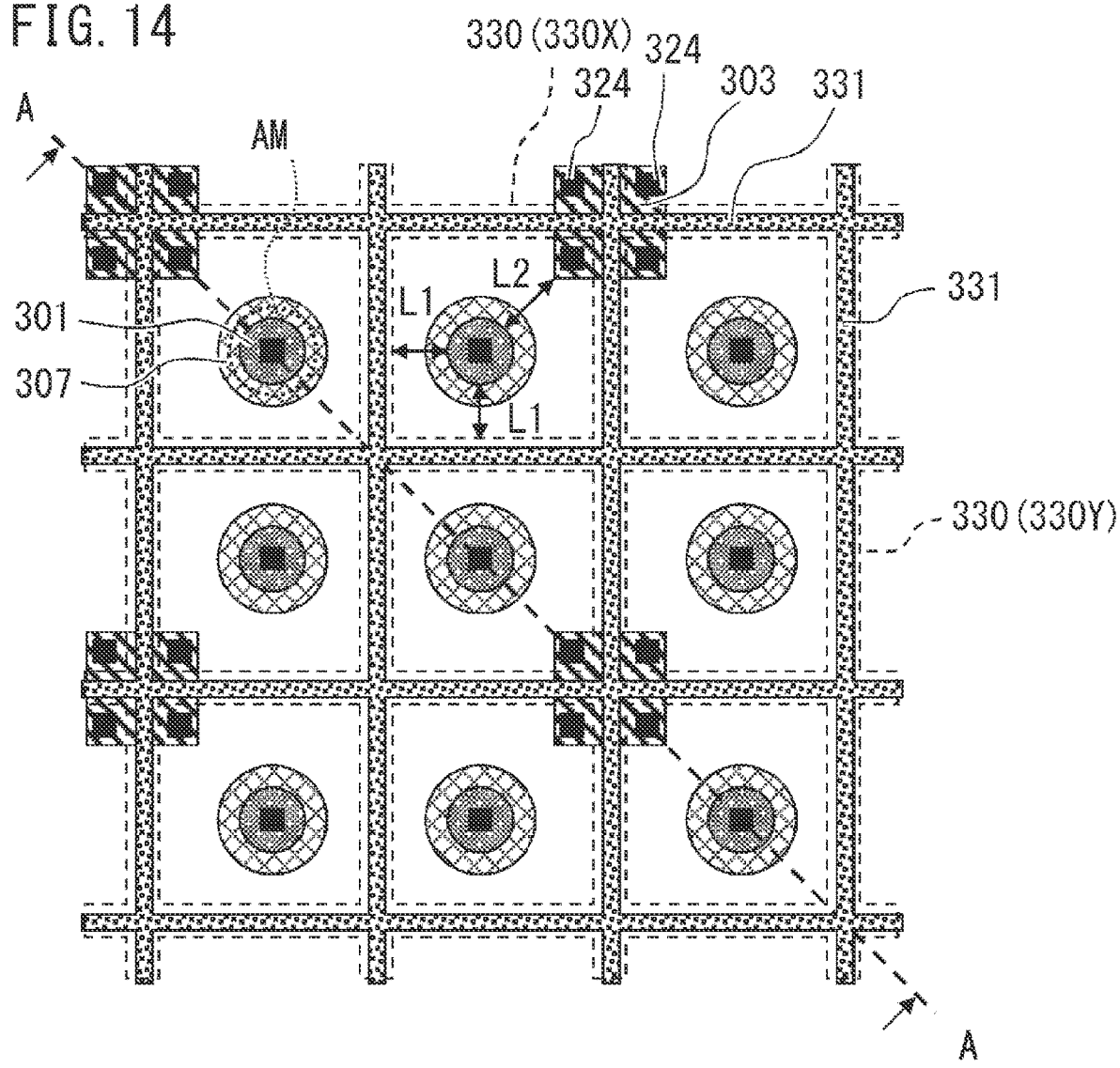
FIG. 14 is a plan view of a photoelectric conversion device according to Example 4.
Figure 15:
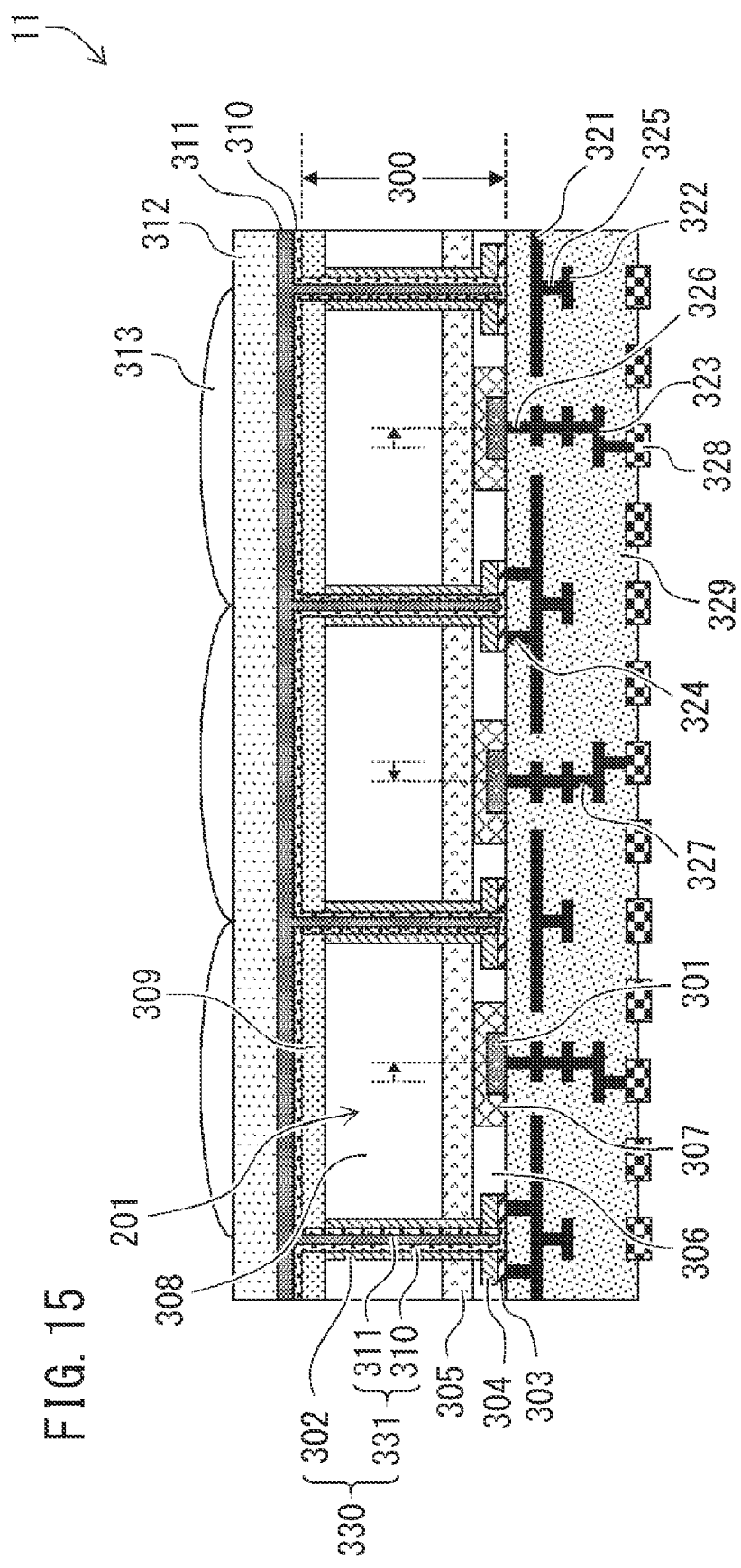
FIG. 15 is a cross-sectional view of the photoelectric conversion device according to Example 4, taken along a diagonal direction.

FIGS. 14 and 15 illustrate the structure of the first member 11 (sensor substrate) of a photoelectric conversion device according to Example 4. FIG. 14 is a plan view illustrating a configuration of the pixel region, schematically illustrating the semiconductor layer 300 of the first member 11 as viewed from the first face side. FIG. 15 is a cross-sectional view taken along line A-A (diagonal direction) in FIG. 14. Portions that correspond to those in the Examples described above are denoted by the same signs. Configurations that are different from those in the Examples described above will be described below.

The contact plugs 324 and connecting portions of the anode wiring are thinned out even further in the present Example. Specifically, the contact plugs 324 and connecting portions (third semiconductor region 303 and fourth semiconductor region 304) are disposed only at positions corresponding to the four corners of a unit made up of the sections of four APDs in a two-row two-column array.

Operations effects that are the same as those of the Examples described above can be obtained by this configuration as well. In addition, further reducing the contact portions to the anode, which can be a source of noise generation, enables DCR to be reduced even further.

Also, the contact plugs 324 are thinned out in the present Example such that the layout of the contact plugs 324 across the row-direction isolation portions 330X is in mirror symmetry, and the layout of the contact plugs 324 across the column-direction isolation portions 330Y is in mirror symmetry. Accordingly, the four contact plugs 324 are assembled surrounding one intersecting portion in this layout, and accordingly the area of the footprint of the connecting portions can be made to be equal to that in Examples 1 and 2. Thus, a stable ohmic junction can be realized with the anode. When the footprint of the connecting portions is small, formation of the mask (resist) becomes difficult, leading to concerns in lower manufacturing yield. However, this problem does not occur with the way of thinning out such as in the present Example. Accordingly, the configuration according to the present Example is advantageous in miniaturization of pixels.

In the configuration according to the present Example, the contact plugs 324 and the connecting portions are present only at one corner of each section of each pixel. Accordingly, disposing the avalanche multiplication portion AM substantially at the middle of the section in the same way as in the Examples described above will result in an asymmetrical electric field acting on the avalanche multiplication portion AM, which is undesirable. Accordingly, the first semiconductor region 301 and the seventh semiconductor region 307 in each of the four sections in the two-row two-column array are preferably disposed at positions deviated toward the center side of the unit made up of the four sections. For example, the first semiconductor region 301 is preferably disposed at a position at which a distance L2 between the connecting portion (303) and the first semiconductor region 301, and a distance L1 between the isolation portions 330X and 330Y situated at the center side of the unit and the first semiconductor region 301, are substantially equal, as illustrated in FIG. 14. According to such a layout, the likelihood of a local high field acting on the first semiconductor region 301 can be reduced.

EXAMPLE 5

Figure 16A:
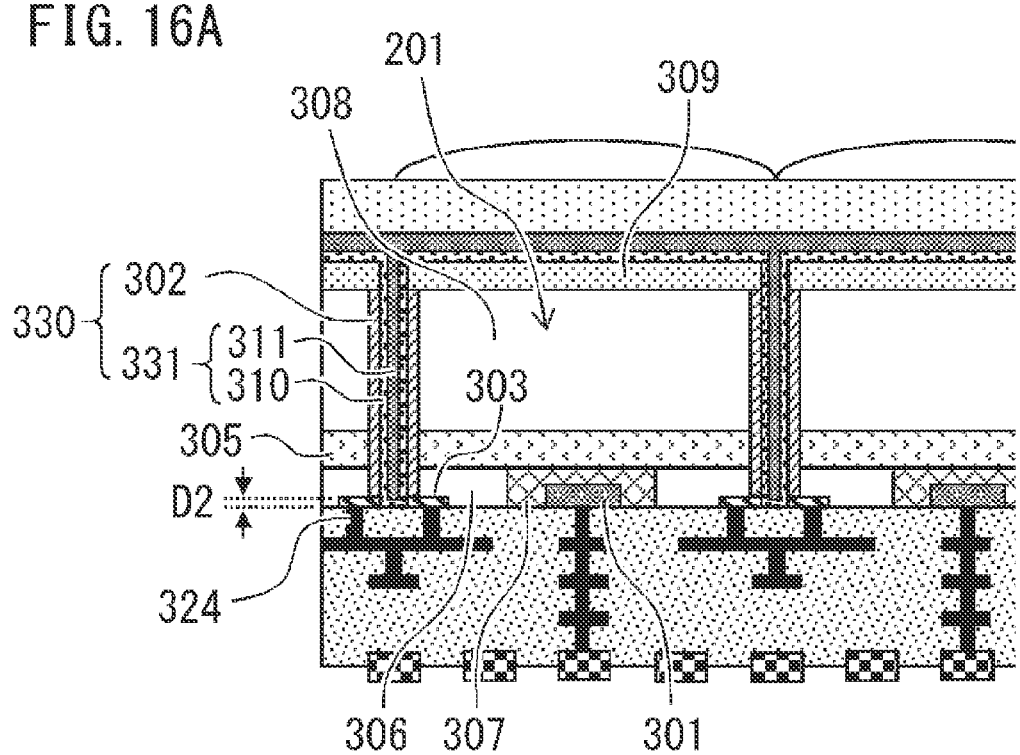
FIGS. 16A and 16B are cross-sectional views of a photoelectric conversion device according to Example 5, taken along a diagonal direction and a midsegment direction.
Figure 16B:
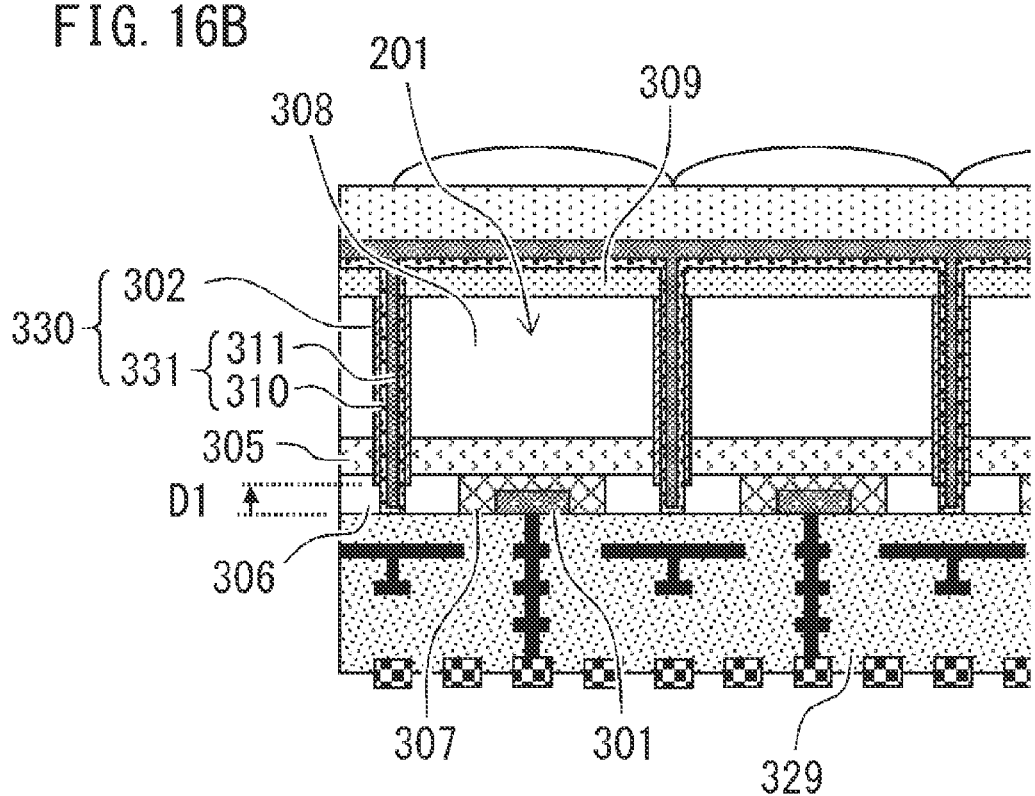

FIGS. 16A and 16B illustrate a structure of the first member 11 (sensor substrate) of a photoelectric conversion device according to Example 5. FIG. 16A is a cross-sectional view of the semiconductor layer 300 taken along a diagonal direction. FIG. 16B is a cross-sectional view of the semiconductor layer 300 taken along a midsegment direction. Portions that correspond to those in the Examples described above are denoted by the same signs. Configurations that are different from those in the Examples described above will be described below.

In the present Example, a point that the connecting portion of the second conducting type for electrically connecting the contact plug 324 of the anode wiring and the second semiconductor region 302 of the isolation portion 330 is formed of the third semiconductor region 303 alone differs from the Examples described above. The relative relation of sizes of the semiconductor regions, and the relative relation of impurity concentration thereof, can be set in the same way as in the Examples described above. Operations effects that are the same as those of the Examples described above can be obtained by this configuration as well.

Also, it can be understood by comparing FIGS. 16A and 16B that in comparison with a depth D2 of the second semiconductor region 302 at positions where the third semiconductor region 303 serving as the connecting portions is disposed, the depth D1 of the second semiconductor region 302 at other positions is deeper in the present Example. According to such a configuration, charges (noise) generated near the first face can be prevented from traveling through the semiconductor region of the second conducting type and intruding into the sensitivity region at places where the connecting portions are not disposed.

EXAMPLE 6

Figure 18:
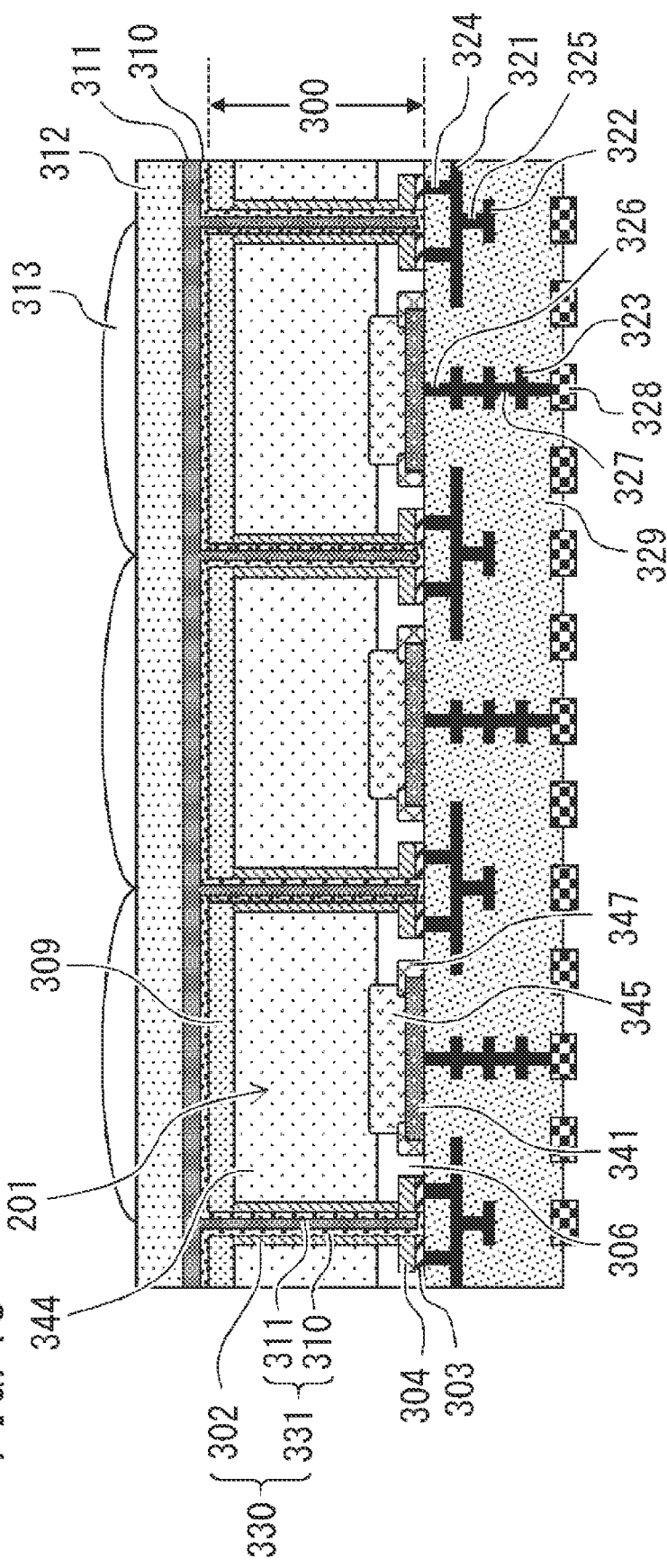
FIG. 18 is a cross-sectional view of the photoelectric conversion device according to Example 6, taken along a diagonal direction.
Figure 19:
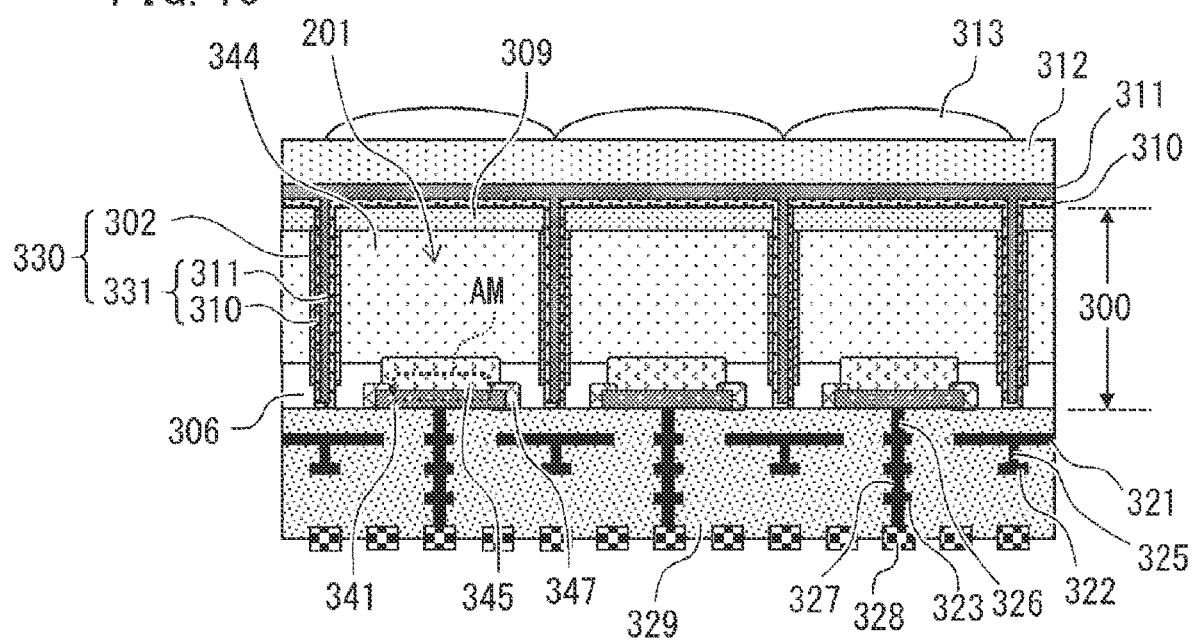
FIG. 19 is a cross-sectional view of the photoelectric conversion device according to Example 6, taken along a midsegment direction.

FIGS. 17, 18, and 19 illustrate a structure of the first member 11 (sensor substrate) of a photoelectric conversion device according to Example 6. FIG. 17 is a plan view illustrating a configuration of the pixel region, schematically illustrating the semiconductor layer 300 of the first member 11 as viewed from the first face side. FIG. 18 is a cross-sectional view taken along line A-A (diagonal direction) in FIG. 17, and FIG. 19 is a cross-sectional view taken along line B-B (midsegment direction) in FIG. 17. Portions that correspond to those in the Examples described above are denoted by the same signs. Configurations that are different from those in the Examples described above will be described below.

In the present Example, the avalanche multiplication portion AM is formed of a first semiconductor region 341 of the first conducting type disposed on the first face, and a fifth semiconductor region 345 of the second conducting type is disposed nearer to the second face side than the first semiconductor region 341. A seventh semiconductor region 347 of the first conducting type that serves as a guard ring is formed in a ring form so as to cover the circumferential portion of the first semiconductor region 341 that is substantially circular.

A semiconductor region 344 of the second conducting type is disposed nearer to the second face side than the fifth semiconductor region 345, and further, the ninth semiconductor region 309 of the second conducting type is disposed on the second face side of the semiconductor region 344. At this time, the impurity concentration of the ninth semiconductor region 309 is preferably higher than the impurity concentration of the semiconductor region 344. Due to such settings, charges obtained by photoelectric conversion at the semiconductor region 344 that is a sensitivity region are collected at the avalanche multiplication portion AM disposed on the first face side, without passing through to the second face side. Accordingly, signal charges can be efficiently read.

Operations effects that are the same as those of the Examples described above can be obtained by the APD 201 according to the present Example as well, by applying the isolation portion 330 and the connecting portions of the same structure as in the Examples described above.

EXAMPLE 7

Variations of the footprint shape of the connecting portions will be described with reference to FIGS. 20A to 20C.

Figure 20A:
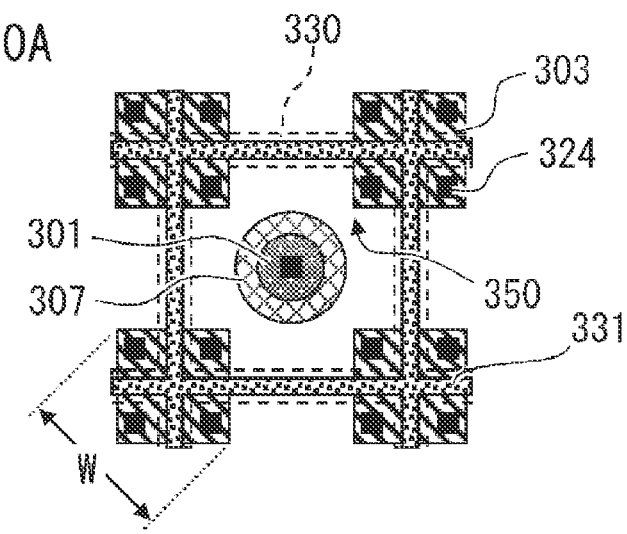
FIGS. 20A to 20C are plan views of a photoelectric conversion device according to Example 7.

FIG. 20A is an example of third semiconductor regions 303 that are substantially square in shape being laid out with the four corners of the squares matching the positions of four contact plugs 324. FIG. 20B is an example of third semiconductor regions 303 that are substantially square in shape being laid out with the diagonal lines of the squares overlaying the isolation portion 330. FIG. 20C is an example in which the connecting portions are formed of third semiconductor regions 303 that are substantially circular in shape.

The size (width) required of the third semiconductor region 303 by design, in order to secure electrical contact with the anode, is determined in advance. For example, assuming that the positions of the contact plugs 324 in FIGS. 20A to 20C are the same, the width of the third semiconductor regions 303 in the diagonal direction needs to be no less than W in each of the shapes. Now, comparing the areas of the third semiconductor regions 303 in each of the shapes, the area of the shape in FIG. 20A is $W^2/2$, the area of the shape in FIG. 20B is $W^2$, and the area of the shape in FIG. 20C is $\pi W^2/4$, and thus it can be understood that the shape in FIG. 20A requires the least area. The third semiconductor region 303 is a source of dark current, and accordingly the smaller the area thereof is, the more preferable. Accordingly, from the perspective of minimizing area, the shape in FIG. 20A is preferable.

Figure 20B:
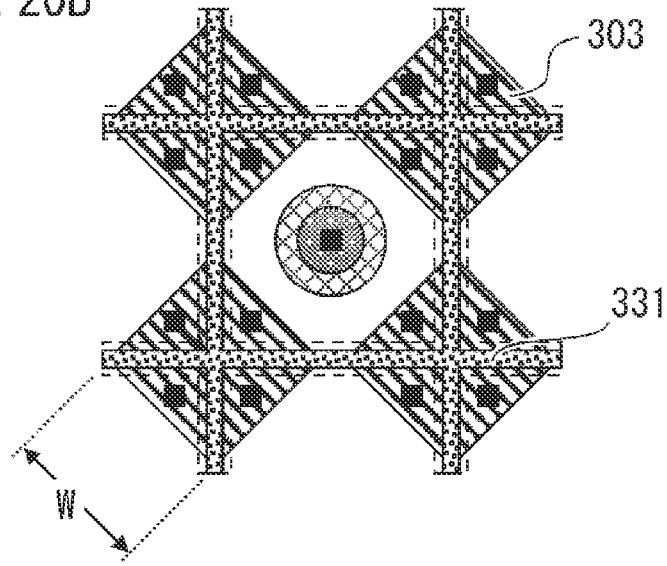
Figure 20C:
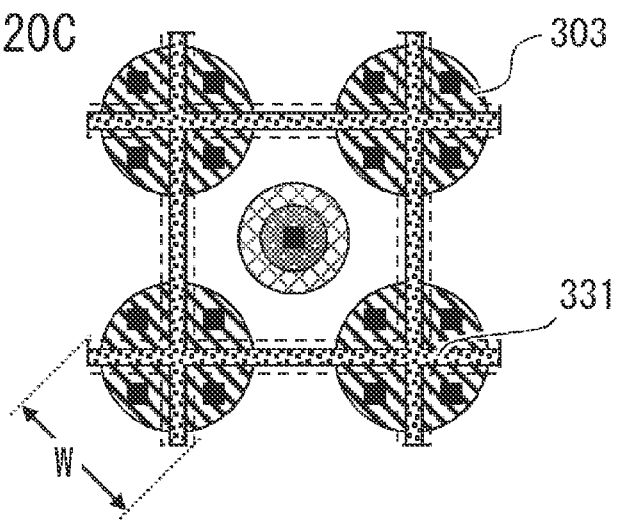

Conversely, the shapes in FIGS. 20B and 20C are advantageous in that there are no corners within the sections (openings) of the pixels. When there are corner portions 350 therein, as in the shape in FIG. 20A for example, there is a likelihood that a local high field will act on the corner portions 350. From the perspective of such electric field concentration occurring less readily, the shapes in FIGS. 20B and 20C in which there are no corners therein can be said to be preferable.

Note that the shapes in FIGS. 20A to 20C are only examples, and the shapes of the connecting portions (third semiconductor region 303) are not limited to these.

EXAMPLE 8

Figure 21:
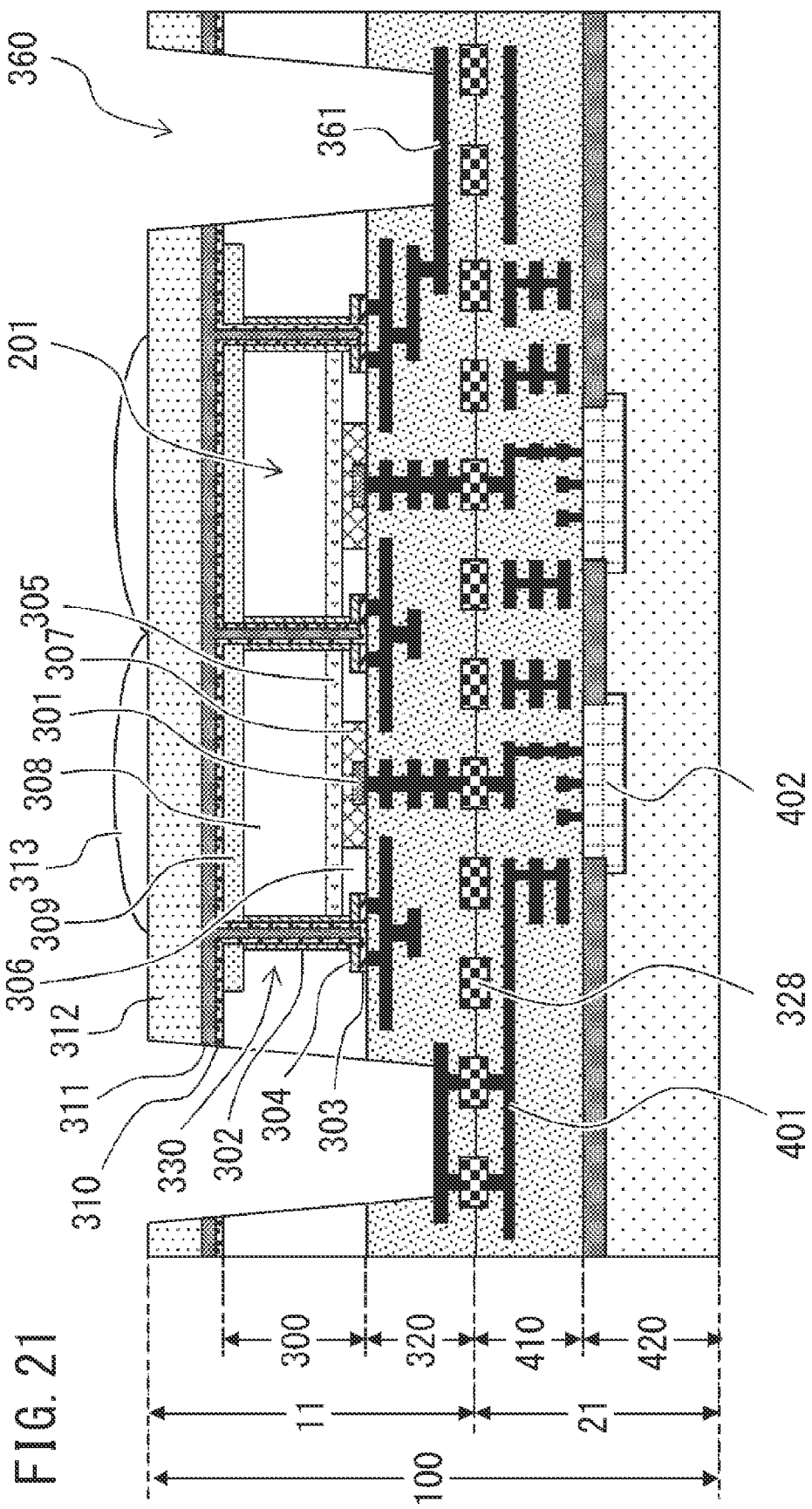
FIG. 21 is a cross-sectional view of a photoelectric conversion device according to Example 8.

FIG. 21 is a cross-sectional view illustrating a configuration example of a photoelectric conversion device 100 that is a stacked-type photoelectric conversion device.

The first member 11 (sensor substrate) has a first semiconductor layer 300 and a first wiring structure 320. The APD 201, the isolation portion 330, the connecting portions (303, 304) and so forth, described in the above Examples, are formed in the first semiconductor layer 300. An opening 360 is formed in the first member 11 from the first face (face of optical incidence) side, reaching to a partway position in the first wiring structure 320, and a pad 361 is exposed at a bottom of the opening 360. This pad 361 is an aluminum electrode used for connecting to an external device, with a bonding wire that is omitted from illustration, for example, being installed.

The second member 21 (circuit substrate) has a second semiconductor layer 420 and a second wiring structure 410. Signal processing units 402 having a plurality of semiconductor devices are formed in the second semiconductor layer 420. Also, wiring 401 relating to the signal processing units 402 is formed in the second wiring structure 410.

The photoelectric conversion device 100 is fabricated by stacking the first member 11 and the second member 21 such that the wiring structures 320 and 410 of each other face each other. Electrical connection between the first member 11 and the second member 21 is performed via bonding portions 328.

EXAMPLE 9

Figure 22:
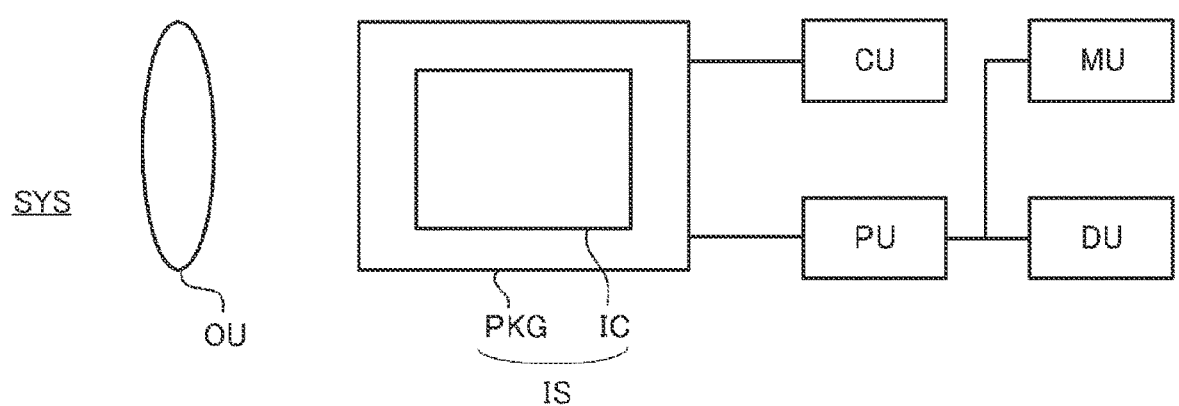
FIG. 22 is a schematic diagram of a photoelectric conversion system according to Example 9.

A photoelectric conversion system according to Example 9 will be described with reference to FIG. 22. FIG. 22 is a block diagram illustrating a schematic configuration of the photoelectric conversion system according to Example 9.

The photoelectric conversion devices described in the above Examples 1 to 8 are applicable to various types of photoelectric conversion systems. The photoelectric conversion systems include at least the photoelectric conversion device according to the Examples described above, and a signal processing unit that processes signals output from the photoelectric conversion device. Examples of an equipment to which such a photoelectric conversion system can be applied to include digital still cameras, digital camcorders, surveillance cameras, photocopiers, facsimile devices, cellular phones, in-vehicle cameras, observation satellites, sensors, measurement instruments, and so forth. Also, a camera module that includes an optical system such as a lens, and an image-capturing device, is also included in an equipment to which the photoelectric conversion system is applied. FIG. 22 exemplifies a block diagram of a digital still camera as an example thereof.

FIG. 22 illustrates an example of a configuration of an image-capturing system SYS configured using an image-capturing apparatus IS. The image-capturing system SYS is a camera or an information terminal that has image-capturing functions. The image-capturing apparatus IS can further include a package PKG that accommodates an image-capturing device IC. The package PKG can include a base to which the image-capturing device IC is fixed, a lid member facing the image-capturing device IC, and a connecting member that connects a terminal provided to the base and a terminal provided to the image-capturing device IC. The image-capturing apparatus IS can include a plurality of image-capturing devices IC installed arrayed in a common package PKG. Also, the image-capturing apparatus IS may have the image-capturing device IC and another semiconductor device IC stacked and installed in the common package PKG.

The image-capturing system SYS can include an optical system OU for imaging upon the image-capturing apparatus IS. The image-capturing system SYS can also include at least one of a control device CU that controls the image-capturing apparatus IS, a processing device PU that processes signals obtained from the image-capturing apparatus IS, a display device DU that displays images acquired from the image-capturing apparatus IS, and a storage device MU that stores images acquired from the image-capturing apparatus IS.

EXAMPLE 10

Figure 23A:
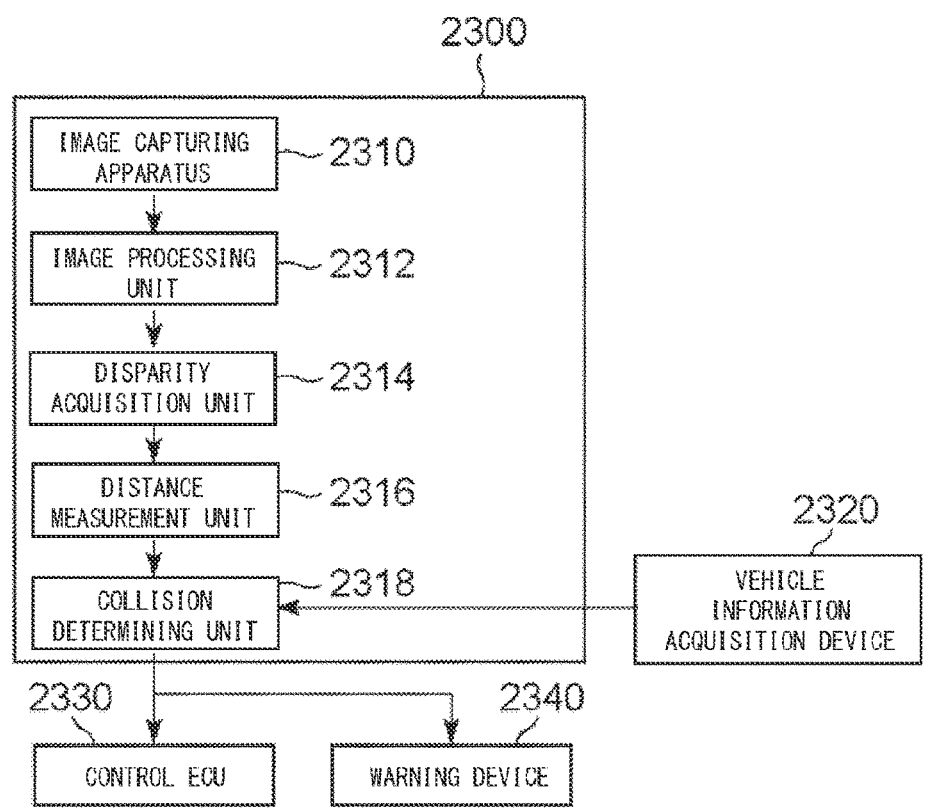
FIGS. 23A and 23B are schematic diagrams of a photoelectric conversion system according to Example 10.
Figure 23B:
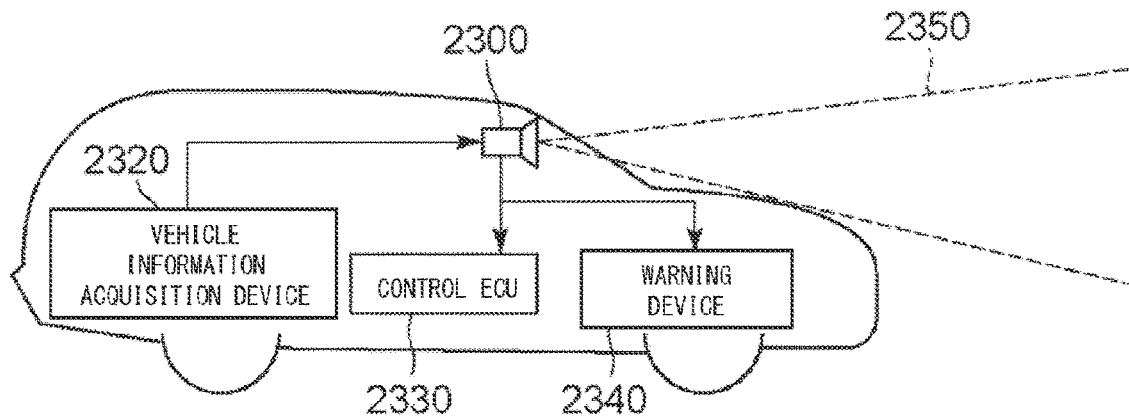

An equipment to which the photoelectric conversion system is applied in Example 10 will be described with reference to FIGS. 23A and 23B. FIGS. 23A and 23B are diagrams illustrating a configuration of the photoelectric conversion system and the equipment according to the present Example.

FIG. 23A illustrates an example of a photoelectric conversion system relating to an in-vehicle camera. A photoelectric conversion system 2300 includes an image-capturing apparatus 2310. The image-capturing apparatus 2310 is the photoelectric conversion device according to any one of the above Examples. The photoelectric conversion system 2300 has an image processing unit 2312 that subjects a plurality of pieces of image data acquired by the image-capturing apparatus 2310 to image processing, and a disparity acquisition unit 2314 that calculates disparity (phase difference of disparity images) from the plurality of pieces of image data acquired by the photoelectric conversion system 2300. The photoelectric conversion system 2300 also has a distance measurement unit 2316 that calculates distance to an object on the basis of the calculated disparity, and a collision determining unit 2318 that determines whether or not there is a likelihood of a collision, on the basis of the calculated distance. The disparity acquisition unit 2314 and the distance measurement unit 2316 are examples of distance information acquisition means for acquiring distance information to an object. That is to say, distance information is information regarding disparity, defocusing amount, distance to an object, and so forth. The collision determining unit 2318 may determine the likelihood of collision using any of such distance information. The distance information acquisition means may be realized by specifically-designed hardware, or may be realized by a software module. Also, the distance information acquisition means may be realized by a field-programmable gate array (FPGA) or an application-specific integrated circuit (ASIC) or the like, or by a combination thereof.

The photoelectric conversion system 2300 is connected to a vehicle information acquisition device 2320, and can acquire vehicle information such as vehicle speed, yaw rate, steering angle, and so forth. Also, the photoelectric conversion system 2300 has connected thereto a control electronic control unit (ECU) 2330 that is a control unit for outputting control signals to generate braking force to the vehicle on the basis of determination results of the collision determining unit 2318. The photoelectric conversion system 2300 also has connected thereto a warning device 2340 that issues a warning to a driver on the basis of the determination results of the collision determining unit 2318. For example, if the likelihood of a collision is found to be high as the results of the determination by the collision determining unit 2318, the control ECU 2330 performs vehicle control for collision avoidance or damage mitigation, such as applying the brakes, letting up on the accelerator, suppressing engine output, and so forth. The warning device 2340 warns the user by sounding an alarm with sound or the like, displaying warning information on a screen of an automotive navigation system or the like, applying vibrations to a seatbelt or steering wheel, and so forth.

In the present Example, the photoelectric conversion system 2300 performs image capturing of the surroundings of the vehicle such as forward or rearward, for example. FIG. 23B illustrates the photoelectric conversion system 2300 in a case of performing image-capturing forward of the vehicle (image-capturing range 2350). The vehicle information acquisition device 2320 sends instructions to the photoelectric conversion system 2300 or the image-capturing apparatus 2310. According to such a configuration, precision of ranging can be further improved.

Although an example of controlling so as not to collide with other vehicles has been described above, the photoelectric conversion system can also be applied to control for automated driving in which other vehicles are followed, control for automated driving avoiding lane departure, and so forth. Further, the photoelectric conversion system is not limited to vehicles such as automobiles and so forth, and can be applied to, for example, ships, aircraft, industrial robots, and other such moving bodies (moving devices). Additionally, the photoelectric conversion system is not limited to application to moving bodies, and can be broadly applied an equipment using object recognition, such as an intelligent transport system (ITS) or the like.

EXAMPLE 11

Figure 24:
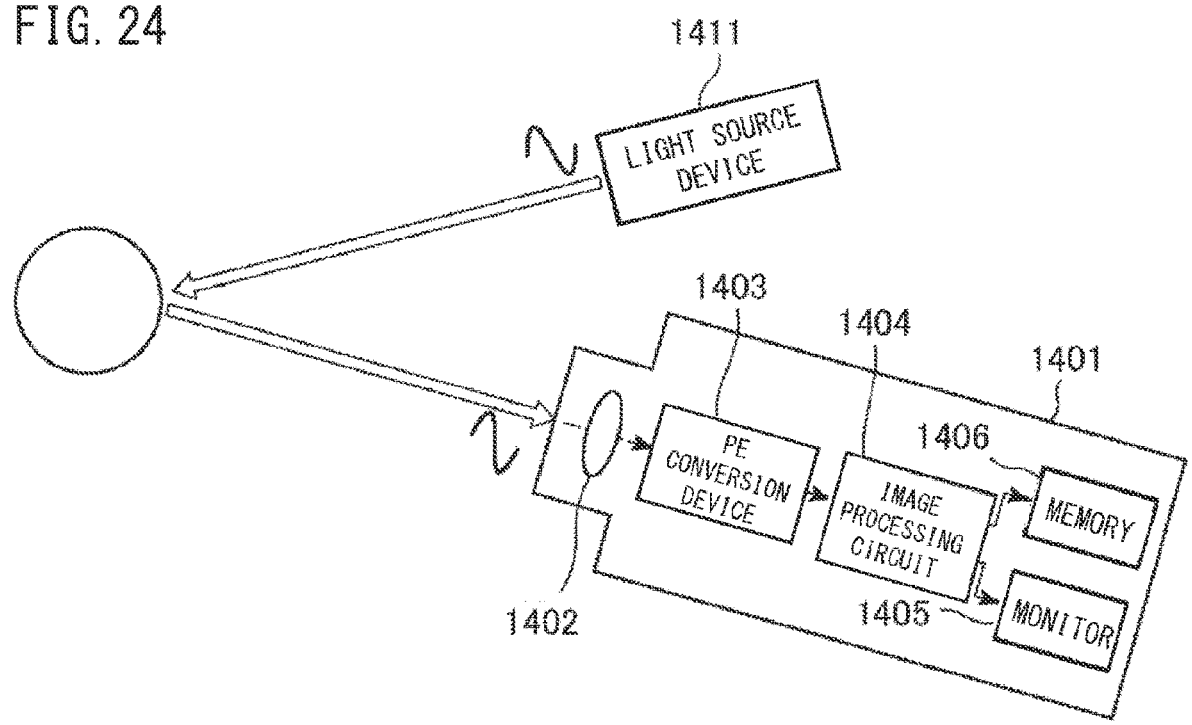
FIG. 24 is a schematic diagram of a photoelectric conversion system according to Example 11.

An equipment to which the photoelectric conversion system is applied in Example 11 will be described with reference to FIG. 24. FIG. 24 is a block diagram illustrating a configuration example of a ranging image sensor that is an example of the equipment to which the photoelectric conversion system according to the present Example is applied.

As illustrated in FIG. 24, a ranging image sensor 1401 includes an optical system 1402, a photoelectric conversion device 1403, an image processing circuit 1404, a monitor 1405, and memory 1406. The ranging image sensor 1401 is capable of acquiring ranging images in accordance with distances to subjects, by projecting light from a light source device 1411 toward a subject and receiving light reflected from the surface of the subject (modulated light or pulsed light).

The optical system 1402 includes one or a plurality of lenses, which guide image light from the subject (incident light) to the photoelectric conversion device 1403 so as to be imaged on a light acceptance face (sensor portion) of the photoelectric conversion device 1403.

The photoelectric conversion device according to any one of the above-described Examples is applied as the photoelectric conversion device 1403, and ranging signals indicating distance, which are obtained from light-reception signals output from the photoelectric conversion device 1403, are supplied to the image processing circuit 1404.

The image processing circuit 1404 performs image processing to construct a ranging image on the basis of the ranging signals supplied from the photoelectric conversion device 1403. Ranging images (image data) acquired by the image processing are then supplied to the monitor 1405 and displayed, or supplied to the memory 1406 and stored (recorded).

The ranging image sensor 1401 configured in this way can acquire more accurate ranging images, by application of the above-described photoelectric conversion device.

EXAMPLE 12

Figure 25:
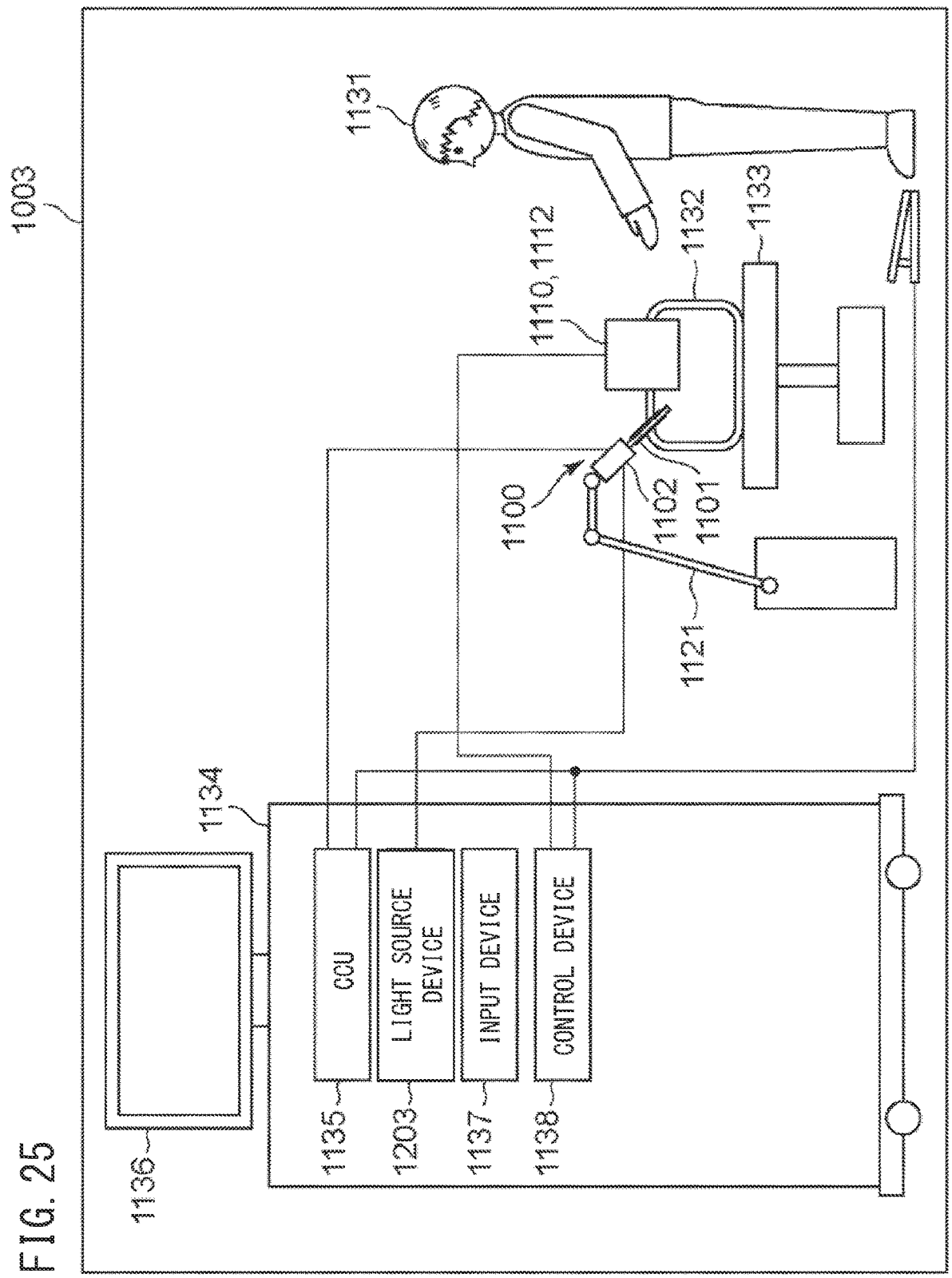
FIG. 25 is a schematic diagram of a photoelectric conversion system according to Example 12.

An equipment to which the photoelectric conversion system is applied in Example 12 will be described with reference to FIG. 25. FIG. 25 is a diagram illustrating a schematic configuration example of an endoscope surgery system that is the equipment to which the photoelectric conversion system according to the present Example is applied.

FIG. 25 illustrates an operator (surgeon) 1131 using an endoscope surgery system 1003 to perform surgery on a patient 1132 on an operating table 1133. As illustrated herein, the endoscope surgery system 1003 includes an endoscope 1100, a surgical instrument 1110, and a cart 1134 in which are loaded various types of devices for endoscopic surgery.

The endoscope 1100 includes a lens tube 1101 of which a region of a certain length from a distal end hereof is inserted into a body cavity of the patient 1132, and a camera head 1102 connected to a basal end of the lens tube 1101. Although the endoscope 1100 is configured as a so-called rigid scope that has the lens tube 1101 that is rigid is illustrated in the example, the endoscope 1100 may be configured as a so-called flexible scope that has a flexible lens tube.

An opening, into which an object lens is fit, is provided at the distal end of the lens tube 1101. A light source device 1203 is connected to the endoscope 1100, light generated by the light source device 1203 is guided to the distal end of the lens tube by a light guide extended through the inside of the lens tube 1101, and is emitted toward an object of observation within the body cavity of the patient 1132 via the object lens. Note that the endoscope 1100 may be a forward-viewing endoscope, or may be a forward-oblique viewing endoscope or a side-viewing endoscope.

An optical system and a photoelectric conversion device are provided inside the camera head 1102, and reflected light (observation light) from the object of observation is collected at this photoelectric conversion device by the optical system. Photoelectric conversion of the observation light is performed by the photoelectric conversion device, thereby generating electric signals corresponding to the observation light, i.e., image signals corresponding to an observation image. The photoelectric conversion device according to any one of the Examples described above can be used as this photoelectric conversion device. The image signals are transmitted to a camera control unit (CCU) 1135 as RAW data.

The CCU 1135 includes a central processing unit (CPU), a graphics processing unit (GPU), and so forth, and centrally controls operations of the endoscope 1100 and a display device 1136. Further, the CCU 1135 receives image signals from the camera head 1102 and subjects these image signals to various types of image processing for displaying an image based on the image signals, such as, for example, developing processing (demosaicing processing) and so forth.

The display device 1136 displays images based on the image signals subjected to image processing by the CCU 1135, under control of the CCU 1135.

The light source device 1203 is made up of a light source such as, for example, light-emitting diodes (LEDs) or the like, and supplies light to be emitted when shooting surgical sites or the like, to the endoscope 1100.

An input device 1137 is an input interface to the endoscope surgery system 1003. Users can input various types of information and input instructions to the endoscope surgery system 1003 via the input device 1137.

A control device 1138 controls driving of energy treatment instruments 1112 for cauterization of tissue, incision, occluding blood vessels, and so forth.

The light source device 1203 that supplies emission light to the endoscope 1100 for shooting surgical sites can be made up of a white light source including, for example, LEDs, a laser light source, or a combination thereof. In a case in which the white light source is made up of a combination of RGB laser light sources, the output intensity and output timing of each color (each wavelength) can be controlled in a highly precise manner, and accordingly, white valance adjustment of captured images can be performed at the light source device 1203. Also, in this case, images corresponding to each of R, G, and B can be captured by time division, by emitting laser light from each of the RGB laser light sources to the object of observation in time division, and controlling driving of the image-capturing device of the camera head 1102 synchronously with the timings of emission. According to this method, color images can be obtained even without providing the image-capturing device with a color filter.

Also, the driving of the light source device 1203 may be controlled so as to change the intensity of light being output every predetermined amount of time. By controlling driving of the image-capturing device of the camera head 1102 synchronously with the timing of change in intensity of light to acquire images in time division, and compositing these images, high-dynamic-range images with no so-called clipped black and clipped white portions can be generated.

Also, the light source device 1203 may be configured to be capable of supplying light of a predetermined wavelength band corresponding to special-light observation. In special-light observation, wavelength dependency of absorption of light by tissue, for example, is used. Specifically, by emitting light of a narrower band in comparison with light emitted for normal observation (i.e., white light), predetermined tissue, such as blood vessels in the surface layer of mucous membranes, can be shot with high contrast. Alternatively, in special-light observation, fluorescent observation may be performed, in which images are obtained by fluorescence occurring due to irradiation by excitation light. Fluorescent observation enables observation of fluorescence of tissue that is irradiated by excitation light, and also locally injecting tissue with a reagent such as indocyanine green (ICG) or the like, and irradiating the tissue with excitation light corresponding to the fluorescence wavelength of the reagent, thereby acquiring fluorescent images and so forth. The light source device 1203 can be configured to be capable of supplying narrowband light and/or excitation light corresponding to such special-light observation.

EXAMPLE 13

An equipment to which the photoelectric conversion system is applied in Example 13 will be described with reference to FIGS. 26A and 26B.

Figure 26A:
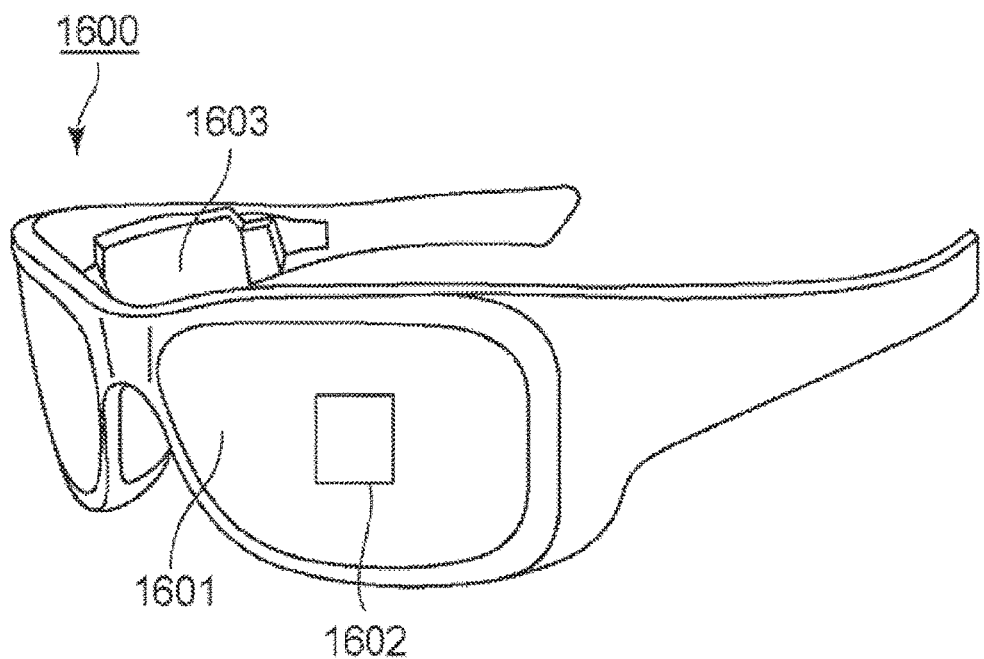
FIGS. 26A and 26B are schematic diagrams of a photoelectric conversion system according to Example 13.

FIG. 26A is a diagram illustrating eyeglasses 1600 (smart glasses) that are an example of the equipment to which the photoelectric conversion system according to the present Example is applied. The eyeglasses 1600 include a photoelectric conversion device 1602. The photoelectric conversion device 1602 is the photoelectric conversion device according to any one of the above Examples. Also, a display device including a light emitting device such as an organic light-emitting diode (OLED) or a light-emitting diode (LED) may be provided on a rear face side of a lens 1601. One or a plurality of the photoelectric conversion device 1602 may be provided. Also, a plurality of types of photoelectric conversion devices 1602 may be used in combination. The position at which the photoelectric conversion device 1602 is disposed is not limited to that illustrated in FIG. 26A.

The eyeglasses 1600 further include a control device 1603. The control device 1603 functions as an electric power source that supplies electric power to the photoelectric conversion device 1602 and the above display device. The control device 1603 also controls operations of the photoelectric conversion device 1602 and the display device. Further, the control device 1603 functions as a signal processing unit that processes signals output from the photoelectric conversion device 1602. An optical system for collecting light to the photoelectric conversion device 1602 is formed in the lens 1601.

Figure 26B:
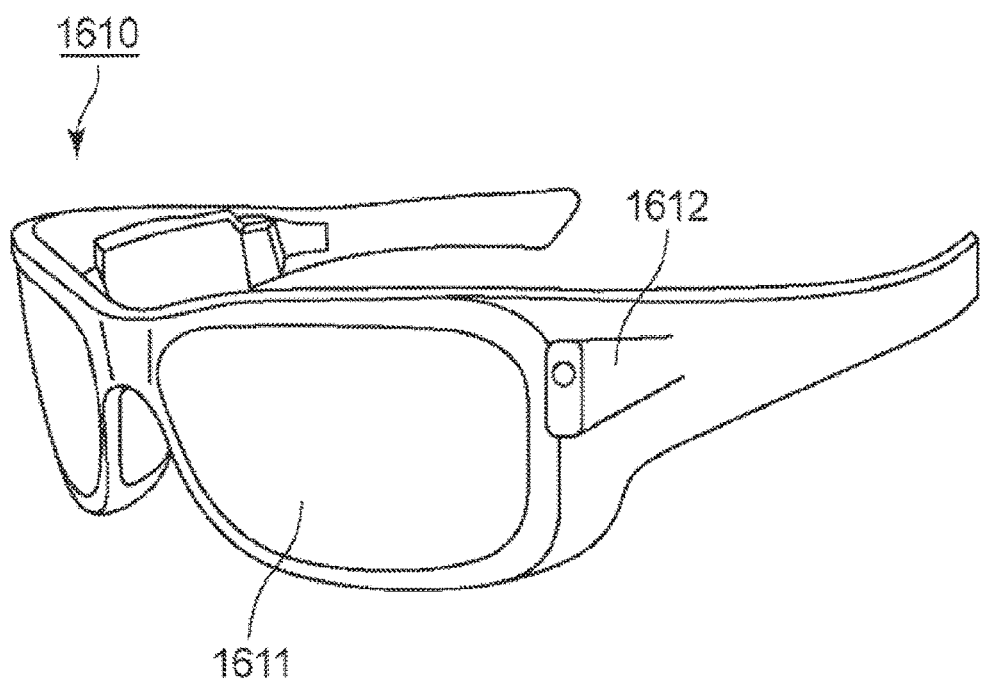

FIG. 26B is a diagram illustrating eyeglasses 1610 (smart glasses) that are an equipment to which the photoelectric conversion system according to the present Example is applied. The photoelectric conversion system is disposed differently from that in FIG. 26A. The eyeglasses 1610 have a control device 1612. A photoelectric conversion device corresponding to the photoelectric conversion device 1602 and a display device are installed in the control device 1612. The photoelectric conversion device within the control device 1612 and an optical system for projecting light emitted from the display device are formed in a lens 1611, and images are projected on the lens 1611. The control device 1612 functions as an electric power source for supplying electric power to the photoelectric conversion device and the display device, and also controls operations of the photoelectric conversion device and the display device. The control device 1612 may have a line-of sight sensing unit for sensing line of sight of a wearer. Infrared light may be used for detecting the line of sight. An infrared light emitting unit emits infrared light to an eyeball of a user that is gazing at the display screen. An image-captured image of the eyeball is acquired by an image-capturing unit that has a photo acceptance unit detecting the reflected light of the emitted infrared light off the eyeball. Inclusion of reducing means for reducing light from the infrared light emitting unit to the display unit in plan view reduces deterioration in image quality.

The line of sign of the user with respect to the displayed image is detected from the image-captured image from the eyeball that is acquired by image capturing using infrared light. Any of known means can be applied to line-of-sight detection using an image-captured image of the eyeball. As one example, a line-of-sight detection method that is based on Purkinje images from reflection of irradiated light at the cornea can be used.

More specifically, line-of-sight detection processing based on corneal reflection detection is performed. Using corneal reflection detection enables a line-of sight vector that represents the orientation (rotational angle) of the eyeball to be calculated on the basis of an image of the pupil included in an image-captured image of the eyeball, and a Purkinje image, and the line of sight of the user to be detected.

The display device according to the present Example may include a photoelectric conversion device that has a photo acceptance unit, and may control display images on the display device on the basis of the line-of-sight information of the user from the photoelectric conversion device.

Specifically, on the basis of the line of sight information, the display device decides a first field-of-view region that the user is gazing at, and a second field-of-view region other than the first field-of-view region. The first field-of-view region and the second field-of-view region may be decided by the control device of the display device, or decided by an external control device and received. In the display region of the display device, display resolution of the first field-of-view region may be controlled to be higher than the display resolution of the second field-of-view region. That is to say, the resolution of the second field-of-view region may be lower than that of the first field-of-view region.

Also, the display region may include a first display region and a second display region that is different from the first display region, and which display region of the first display region and the second display region is higher in degree of priority may be decided on the basis of the line-of-sight information. The first field-of-view region and the second field-of-view region may be decided by the control device of the display device, or decided by an external control device and received. The resolution of the region with high priority may be controlled to be higher than the resolution of the region other than the region with high priority. That is to say, the resolution of the region with relatively low priority may be lowered.

Note that artificial intelligence (AI) may be used to decide the first field-of-view region and the region with high priority. The AI may be a model configured to estimate the angle of the line of sight and the distance to a target object in the line of sight from an image of an eyeball, using the image of the eyeball and the direction that the eyeball in this image was actually directed at, as training data. Any one of the display device, the photoelectric conversion device, and an external device may have the AI program. In a case in which an external device has the AI program, the AI program is delivered to the display device by communication.

In a case of performing display control on the basis of visual recognition sensing, application can be suitably made to smart glasses further having a photoelectric conversion device that performs external image capturing. The smart glasses can display image-captured external information in real-time.

EXAMPLE 14

The above-described photoelectric conversion device and photoelectric conversion system may be applied to, for example, an electronic equipment such as so-called smartphones, tablets, and so forth.

Figure 27A:
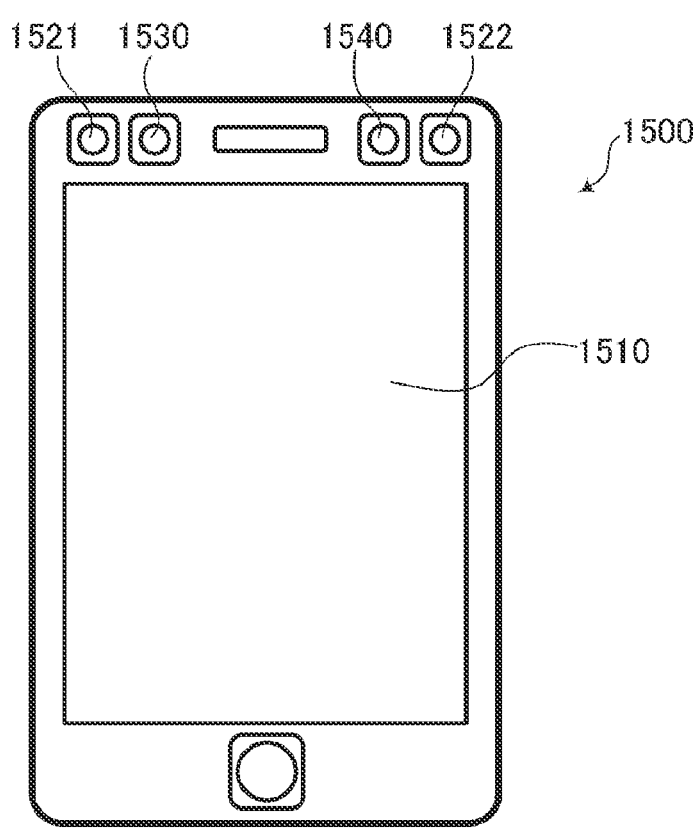
FIGS. 27A and 27B are schematic diagrams of a photoelectric conversion system according to Example 14.
Figure 27B:
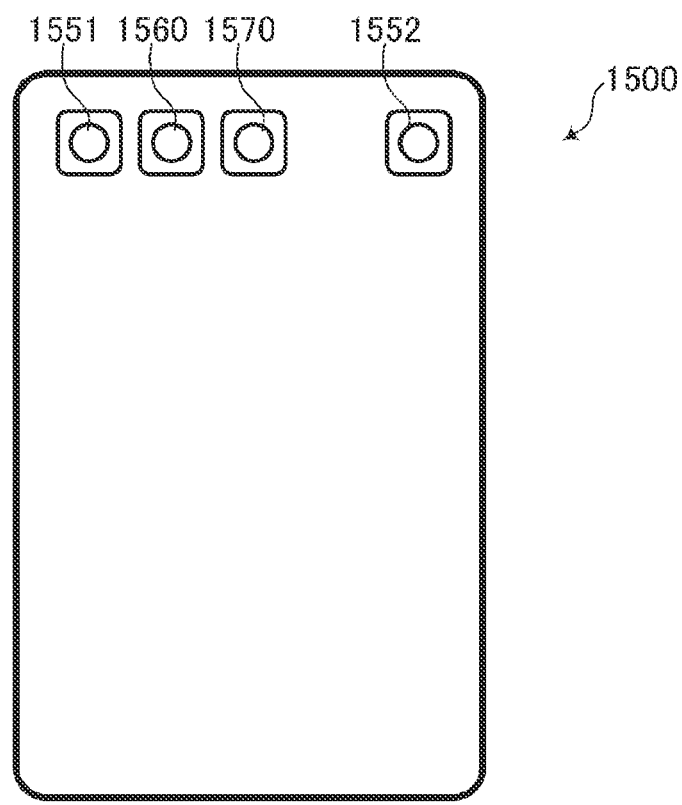

FIGS. 27A and 27B are diagrams illustrating an example of an electronic equipment 1500 in which a photoelectric conversion device is installed. FIG. 27A illustrates a front-face side of the electronic equipment 1500, and FIG. 27B illustrates a rear-face side of the electronic equipment 1500.

As illustrated in FIG. 27A, a display 1510 on which images are displayed is disposed at the middle of the front face of the electronic equipment 1500. Front cameras 1521 and 1522 in which the photoelectric conversion device is used, an infrared (IR) light source 1530 that emits infrared light, and a visible-light light source 1540 that emits visible light, are disposed along an upper side of the front face of the electronic equipment 1500.

Also, as illustrated in FIG. 27B, rear cameras 1551 and 1552 in which the photoelectric conversion device is used, an IR light source 1560 that emits infrared light, and a visible-light light source 1570 that emits visible light, are disposed along an upper side of the rear face of the electronic equipment 1500.

The electronic equipment 1500 configured in this way can perform image capturing of even higher-quality images, for example, by application of the above-described photoelectric conversion device. Note that the photoelectric conversion device can be further applied to electronic equipment such as infrared sensors, ranging sensors using active infrared light sources, security cameras, identity or biometric authentication cameras, and so forth. Accordingly, the precision, performance, and so forth of such electronic equipment can be improved.

Other Embodiments

While various types of equipments have been described in the above Examples, mechanical devices may also be included. A mechanical device in a camera can drive parts of an optical system for zooming, focus, and shutter operations. Alternatively, a mechanical device in a camera can move the photoelectric conversion device for camera shake reduction.

Also, the equipment may be a transportation equipment such as a vehicle, ship, aircraft, or the like. A mechanical device in the transportation equipment may be used as a movement device. The equipment serving as the transportation equipment is suitably applied to arrangements for transporting a photoelectric conversion device, and using shooting functions for assistance and/or automation of driving (piloting). A processing device for assistance and/or automation of driving (piloting) can perform processing for operating mechanical devices serving as a movement device, on the basis of information obtained by the photoelectric conversion device.

Technology according to the present disclosure is not limited to the above Examples, and various types of modifications can be made. For example, examples in which part of the configuration of one of the Examples is added to another Example, or substituted for part of the configuration of another Example, are included in the Examples of the technology according to the present disclosure. It should be noted that the above Examples are merely examples illustrated for substantiation of the technology according to the present disclosure, and should not be used to restrictively construe the technical scope of the technology according to the present disclosure. That is to say, the technology according to the preset disclosure can be carried out in various forms without departing from the technical idea thereof, or principal features thereof.

According to the technology of the present disclosure, in high-definition photoelectric conversion devices, DCR can be suppressed and deterioration in sensitivity can be suppressed while maintaining inter-pixel isolation performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000023, filed on Jan. 1, 2022, which is hereby incorporated by reference herein in its entirety.

What is claimed is:

1. A photoelectric conversion device, comprising:
   a first avalanche photodiode and a second avalanche photodiode that each have a first semiconductor region of a first conducting type in which a carrier of a same conducting type as a signal charge is a majority carrier;
   an isolation portion that is disposed between the first avalanche photodiode and the second avalanche photodiode, and that includes a second semiconductor region of a second conducting type that is a conducting type that is different from the first conducting type; and
   a connecting portion that electrically connects a contact plug of anode wiring and the second semiconductor region of the isolation portion to each other, wherein
   the connecting portion includes
      a third semiconductor region of the second conducting type that is connected to the contact plug of the anode wiring, and
      a fourth semiconductor region of the second conducting type that is disposed between the third semiconductor region and the second semiconductor region,
   an impurity concentration of the third semiconductor region is higher than the impurity concentration of the second semiconductor region,
   the impurity concentration of the fourth semiconductor region is lower than the impurity concentration of the third semiconductor region, and
   with respect to a first direction that is a direction in which the first avalanche photodiode and the second avalanche photodiode are arrayed, a width of the isolation portion is smaller than a width of the connecting portion.

2. The photoelectric conversion device according to claim 1, wherein
   the impurity concentration of the fourth semiconductor region is the same as or lower than the impurity concentration of the second semiconductor region.

3. The photoelectric conversion device according to claim 1, further comprising:
   a fifth semiconductor region of the second conducting type that is disposed further toward an incident side of light than the first semiconductor region, wherein
   the first semiconductor region and the fifth semiconductor region form an avalanche multiplication portion.

4. The photoelectric conversion device according to claim 3, further comprising:

a sixth semiconductor region that is disposed between the connecting portion and the fifth semiconductor region, wherein the sixth semiconductor region is a semiconductor region of the first conducting type of which the impurity concentration that is lower than the impurity concentration of the first semiconductor region, or a semiconductor region of the second conducting type of which the impurity concentration is lower than the impurity concentration of the fifth semiconductor region.

5. The photoelectric conversion device according to claim 1, wherein a width of the third semiconductor region in the first direction and the width of the fourth semiconductor region in the first direction are the same.

6. The photoelectric conversion device according to claim 1, wherein the isolation portion further includes an insulator that isolates the first avalanche photodiode and the second avalanche photodiode from each other, wherein the second semiconductor region is disposed between the insulator and the avalanche photodiodes.

7. The photoelectric conversion device according to claim 6, wherein the insulator has a portion that is not covered by a semiconductor region of the second conducting type.

8. The photoelectric conversion device according to claim 1, wherein the isolation portion is formed in a grid form by a plurality of row-direction isolation portions extending in a row direction and a plurality of column-direction isolation portions extending in a column direction, an avalanche photodiode is disposed in each section sectioned by the isolation portion having the grid form, and the first avalanche photodiode and the second avalanche photodiode are avalanche photodiodes arrayed in a diagonal direction of the sections, and the connecting portion is formed at an intersecting portion of the row-direction isolation portions and the column-direction isolation portions.

9. The photoelectric conversion device according to claim 8, wherein the first semiconductor region of each of the four sections making up the unit is disposed deviated toward a center side of the unit.

10. A photoelectric conversion system, comprising:

the photoelectric conversion device according to claim 1; and a signal processing unit that processes signals output from the photoelectric conversion device.

11. An equipment, comprising:

the photoelectric conversion device according to claim 1; and at least one of an optical system corresponding to the photoelectric conversion device, a control device that controls the photoelectric conversion device, a processing device that processes signals output from the photoelectric conversion device, a display device that displays information acquired by the photoelectric conversion device, a storage device that stores information acquired by the photoelectric conversion device, and a mechanical device that operates on the basis of information acquired by the photoelectric conversion device.

12. A photoelectric conversion device, comprising:

a first avalanche photodiode and a second avalanche photodiode that each have a first semiconductor region of a first conducting type in which a carrier of a same conducting type as a signal charge is a majority carrier;

an isolation portion that is disposed between the first avalanche photodiode and the second avalanche photodiode, and that includes a second semiconductor region of a second conducting type that is a conducting type that is different from the first conducting type;

a connecting portion of the second conducting type that electrically connects a contact plug of anode wiring and the second semiconductor region of the isolation portion to each other;

a fifth semiconductor region of the second conducting type that is disposed further toward an incident side of light than the first semiconductor region; and a sixth semiconductor region that is made up of a semiconductor region of the first conducting type of which the impurity concentration that is lower than the impurity concentration of the first semiconductor region, or a semiconductor region of the second conducting type of which the impurity concentration is lower than the impurity concentration of the fifth semiconductor region, wherein the first semiconductor region and the fifth semiconductor region form an avalanche multiplication portion, with respect to a first direction that is a direction in which the first avalanche photodiode and the second avalanche photodiode are arrayed, a width of the isolation portion is smaller than a width of the connecting portion, and the sixth semiconductor region is disposed between the connecting portion and the fifth semiconductor region.

13. The photoelectric conversion device according to claim 12, wherein the connecting portion is disposed on a first face of a semiconductor layer, the second semiconductor region is disposed at a position within the semiconductor layer that is deeper than the depth at which the connecting portion is disposed, as viewed from the first face, and a depth of the second semiconductor region at the position at which the connecting portion is disposed, and the depth of the second semiconductor region at other positions, are different.

14. The photoelectric conversion device according to claim 13, wherein in comparison with the depth of the second semiconductor region at the position at which the connecting portion is disposed, the depth of the second semiconductor region at other positions is deeper.

15. The photoelectric conversion device according to claim 12, wherein the isolation portion further includes an insulator that isolates the first avalanche photodiode and the second avalanche photodiode from each other, wherein the second semiconductor region is disposed between the insulator and the avalanche photodiodes.

16. The photoelectric conversion device according to claim 15, wherein the insulator has a portion that is not covered by a semiconductor region of the second conducting type.

17. The photoelectric conversion device according to claim 12, wherein
 the isolation portion is formed in a grid form by a plurality of row-direction isolation portions extending in a row direction and a plurality of column-direction isolation portions extending in a column direction,
 an avalanche photodiode is disposed in each section sectioned by the isolation portion having the grid form, and the first avalanche photodiode and the second avalanche photodiode are avalanche photodiodes arrayed in a diagonal direction of the sections, and
 the connecting portion is formed at an intersecting portion of the row-direction isolation portions and the column-direction isolation portions.

18. The photoelectric conversion device according to claim 17, wherein
 the first semiconductor region of each of the four sections making up the unit is disposed deviated toward a center side of the unit.

19. A photoelectric conversion system, comprising:
 the photoelectric conversion device according to claim 12; and
 a signal processing unit that processes signals output from the photoelectric conversion device.

20. An equipment, comprising:
 the photoelectric conversion device according to claim 12; and
 at least one of
  an optical system corresponding to the photoelectric conversion device,
  a control device that controls the photoelectric conversion device,
  a processing device that processes signals output from the photoelectric conversion device,
  a display device that displays information acquired by the photoelectric conversion device,
  a storage device that stores information acquired by the photoelectric conversion device, and
  a mechanical device that operates on the basis of information acquired by the photoelectric conversion device.

* * * * *